US012622057B2

(12) United States Patent
Cheng et al.

(10) Patent No.: US 12,622,057 B2
(45) Date of Patent: May 5, 2026

(54) DISPLAY SUBSTRATE AND MANUFACTURE METHOD THEREOF, DISPLAY APPARATUS

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Leilei Cheng, Beijing (CN); Cheng Xu, Beijing (CN); Jie Liu, Beijing (CN); Chunjie Xu, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 392 days.

(21) Appl. No.: 17/764,706

(22) PCT Filed: Mar. 30, 2021

(86) PCT No.: PCT/CN2021/083857
§ 371 (c)(1),
(2) Date: Mar. 29, 2022

(87) PCT Pub. No.: WO2022/204922
PCT Pub. Date: Oct. 6, 2022

(65) Prior Publication Data
US 2023/0337466 A1 Oct. 19, 2023

(51) Int. Cl.
*H10D 86/40* (2025.01)
*H10K 59/12* (2023.01)
(Continued)

(52) U.S. Cl.
CPC ....... *H10D 86/481* (2025.01); *H10K 59/1201* (2023.02); *H10K 59/1213* (2023.02);
(Continued)

(58) Field of Classification Search
CPC ........... H10K 59/1213; H10K 59/1201; H10K 59/1216; H10K 59/1315; H10K 59/8792;
(Continued)

(56) References Cited

U.S. PATENT DOCUMENTS 11,217,656 B2 * 1/2022 Li ........................ H01L 27/1251
11,437,440 B2 * 9/2022 Yuan .................... H10K 59/126
(Continued)

FOREIGN PATENT DOCUMENTS

CN 106920814 A 7/2017
CN 110265412 A 9/2019
(Continued)

*Primary Examiner* — Bitew A Dinke
(74) *Attorney, Agent, or Firm* — Dilworth & Barrese, LLP.; Michael J. Musella, Esq.

(57) ABSTRACT

A display substrate and a manufacture method thereof, and a display apparatus are provided. The base substrate includes a base substrate, the base substrate is provided with a plurality of pixels in an array, one pixel includes a plurality of sub-pixels, each sub-pixel includes a light-emitting device and a pixel circuit driving the light-emitting device to emit light, and the pixel circuit includes a storage capacitor, a driving transistor and a data writing transistor; the first electrode of the driving transistor receives a first power voltage; the second electrode of the driving transistor is connected to the light-emitting device; at least part of the plurality of sub-pixels includes a first via hole, and the first electrode of the data writing transistor is electrically connected to the gate electrode of the driving transistor and the active layer of the data writing transistor through the first via hole.

18 Claims, 10 Drawing Sheets

(51) Int. Cl.
| | |
|---|---|
| *H10K 59/121* | (2023.01) |
| *H10K 59/131* | (2023.01) |
| *H10K 59/80* | (2023.01) |
| *H10K 59/00* | (2023.01) |

(52) U.S. Cl.
CPC ..... *H10K 59/1216* (2023.02); *H10K 59/1315* (2023.02); *H10K 59/8792* (2023.02); *H10K 59/00* (2023.02)

(58) Field of Classification Search
CPC .............. H10K 59/00; H01L 29/42384; H01L 2029/42388; H01L 27/1255
See application file for complete search history.

(56) References Cited

U.S. PATENT DOCUMENTS

| | | | | |
|---|---|---|---|---|
| 11,444,132 | B2 * | 9/2022 | Wu | H10K 59/1213 |
| 11,476,310 | B2 * | 10/2022 | Wu | H10K 59/131 |
| 11,581,372 | B2 * | 2/2023 | Wu | H10K 59/353 |
| 11,937,480 | B2 * | 3/2024 | Wu | H01L 27/1255 |
| 2017/0309227 | A1 * | 10/2017 | Ebisuno | H10K 59/131 |
| 2020/0091193 | A1 * | 3/2020 | Ren | H01L 27/1248 |
| 2020/0119126 | A1 * | 4/2020 | Jo | H10K 59/126 |
| 2020/0402466 | A1 | 12/2020 | Park et al. | |
| 2020/0411622 | A1 | 12/2020 | Sun et al. | |
| 2021/0202603 | A1 * | 7/2021 | Wu | H10K 59/1216 |
| 2021/0202604 | A1 * | 7/2021 | Wu | H10K 59/353 |
| 2021/0202605 | A1 * | 7/2021 | Wu | H10K 59/1213 |
| 2021/0350748 | A1 | 11/2021 | Dong et al. | |
| 2021/0408160 | A1 * | 12/2021 | Yuan | H10K 59/1213 |
| 2022/0199707 | A1 * | 6/2022 | Park | G09G 3/32 |
| 2022/0208878 | A1 * | 6/2022 | Jang | H10K 59/131 |
| 2023/0363223 | A1 * | 11/2023 | Zhang | H10K 59/1315 |

FOREIGN PATENT DOCUMENTS

| | | | |
|---|---|---|---|
| CN | 210984240 U | 7/2020 | |
| CN | 212257399 U | 12/2020 | |
| CN | 112331714 A * | 2/2021 | ......... H10K 59/1213 |

* cited by examiner

10

170

104

504

DISPLAY SUBSTRATE AND MANUFACTURE METHOD THEREOF, DISPLAY APPARATUS

TECHNICAL FIELD

At least one embodiment of the present disclosure relates to a display substrate and a manufacture method thereof, and a display apparatus.

BACKGROUND

In the display field, organic light-emitting diode (OLED) display panels have characteristics of self-illumination, high contrast, low energy consumption, wide viewing angle, fast response speed, being capable of being used in flexible panels, wide using temperature range, simple manufacture and so on, and have a broad development prospect.

SUMMARY

At least one embodiment of the present disclosure provides a display substrate, the display substrate comprises a base substrate, the base substrate is provided with a plurality of pixels in an array, at least part of the plurality of pixels comprise a plurality of sub-pixels, at least part of the plurality of sub-pixels comprises a light-emitting device and a pixel circuit configured to drive the light-emitting device to emit light, and the pixel circuit comprises a storage capacitor, a driving transistor and a data writing transistor, the driving transistor comprises an active layer, a gate electrode, a first electrode and a second electrode, the data writing transistor comprises an active layer, a gate electrode, a first electrode and a second electrode; the first electrode of the driving transistor is configured to receive a first power voltage, and the second electrode of the driving transistor is connected to the light-emitting device to control the light-emitting device to emit light; at least part of the plurality of sub-pixels comprises a first via hole, and the first electrode of the data writing transistor is electrically connected to the gate electrode of the driving transistor and the active layer of the data writing transistor through the first via hole.

For example, in the display substrate provided by at least one embodiment of the present disclosure, the gate electrode of the driving transistor comprises a main portion and an extension portion connected to the main portion, an orthographic projection of the main portion on the base substrate is overlapped with an orthographic projection of the active layer of the driving transistor on the base substrate, and the extension portion extends from the main portion, and the extension portion is electrically connected to the first electrode of the data writing transistor and the active layer of the data writing transistor through the first via hole.

For example, in the display substrate provided by at least one embodiment of the present disclosure, the first electrode of the data writing transistor comprises a first conductive portion and a second conductive portion that are stacked with each other in a direction perpendicular to the base substrate, and the second conductive portion is on a side of the first conductive portion away from the base substrate; the gate electrode of the driving transistor is on a side of the first conductive portion close to the second conductive portion and is spaced apart from the first conductive portion, and the second conductive portion is in contact with the gate electrode of the driving transistor and the first conductive portion through the first via hole; the display substrate further comprises a connection portion which is overlapped with the extension portion in the direction perpendicular to the base substrate, and connects the first conductive portion with the active layer of the data writing transistor; the connection portion, the first conductive portion and the active layer of the data writing transistor constitute an integrated structure.

For example, in the display substrate provided by at least one embodiment of the present disclosure, a material of the second conductive portion and a material of the connection portion comprise a same semiconductor material, and the semiconductor material in the first conductive portion is converted into a conductive material.

For example, in the display substrate provided by at least one embodiment of the present disclosure, the first conductive portion comprises a first sub-portion on a first side of the extension portion, the second conductive portion is in direct contact with the first sub-portion through the first via hole on the first side of the extension portion; the second conductive portion extends from the first side of the extension portion to the extension portion in the first via hole to contact at least part of an upper surface of the extension portion away from the base substrate.

For example, in the display substrate provided by at least one embodiment of the present disclosure, the first conductive portion further comprises a second sub-portion on a second side of the extension portion, the second side of the extension portion is opposite to the first side of the extension portion, the second conductive portion extends in the first via hole from the first side of the extension portion to the extension portion, and extends across over the extension portion to extend to the second side of the extension portion, and the second conductive portion is in direct contact with the second sub-portion through the first via hole on the second side.

For example, the display substrate provided by at least one embodiment of the present disclosure further comprises a gate insulation layer and a first insulation layer; the gate insulation layer is between the gate electrode of the driving transistor and the active layer of the driving transistor; the gate electrode of the driving transistor is on a side of the gate insulation layer away from the base substrate; the first insulation layer is on a side of the gate electrode of the driving transistor away from the base substrate; the first via hole penetrates the gate insulation layer and the first insulation layer; the extension portion comprises a side surface intersecting the upper surface, and the second conductive portion further covers the side surface of the extension portion and contacts the side surface of the extension portion; the gate insulation layer comprises an upper surface and a side surface intersecting the upper surface of the gate insulation layer, an included angle, close to the extension portion, in included angles between the side surface of the extension portion and a plane where the upper surface of the extension portion is located is a first included angle, and an included angle, close to the extension portion, in included angles between the side surface of the gate insulation layer and the plane where the upper surface of the extension portion is located is a second included angle, the second conductive portion comprises a middle portion in direct contact with the extension portion, and an included angle, close to the extension portion, in included angles between a side surface of the middle portion and the plane where the upper surface of the extension portion is located is a third included angle; the first included angle is less than the second included angle, or the first included angle is greater than the third included angle and the third included angle is greater than the second included angle.

For example, in the display substrate provided by at least one embodiment of the present disclosure, the storage capacitor comprises a first capacitor electrode and a second capacitor electrode; at least part of the second capacitor electrode and the first electrode of the driving transistor are in a same layer and constitute an integrated structure; and the first capacitor electrode is insulated from the second capacitor electrode, wherein the first capacitor electrode and the active layer of the driving transistor are in a same layer and constitute an integrated structure, the second capacitor electrode and the first capacitor electrode respectively constitute two electrodes of a first capacitor of the storage capacitor.

For example, the display substrate provided by at least one embodiment of the present disclosure further comprises a light shielding layer that is opaque; the active layer of the driving transistor is in an orthographic projection of the light shielding layer on the base substrate, and the light shielding layer is electrically connected to the second capacitor electrode of the first capacitor, the light shielding layer is insulated from the first capacitor electrode of the first capacitor and at least partially overlapped with the first capacitor electrode of the first capacitor in a direction perpendicular to the base substrate to serve as a third capacitor electrode of the storage capacitor, the third capacitor electrode and the first capacitor electrode respectively constitute two electrodes of a second capacitor of the storage capacitor, and the second capacitor is connected in parallel with the first capacitor.

For example, in the display substrate provided by at least one embodiment of the present disclosure, the first electrode of the driving transistor is on a side of the active layer of the driving transistor away from the base substrate, and the light shielding layer is on a side of the active layer of the driving transistor close to the base substrate.

For example, in the display substrate provided by at least one embodiment of the present disclosure, the second conductive portion and the first electrode of the driving transistor are in a same layer and are made of a same material.

For example, the display substrate provided by at least one embodiment of the present disclosure further comprises a signal line, the signal line comprises a first layer, a second layer and a third layer that are stacked sequentially in a direction perpendicular to the base substrate and away from the base substrate; the first layer is spaced apart from the second layer, the signal line further comprises a signal line via hole, and the third layer is electrically connected to the second layer and the first layer through the signal line via hole.

For example, in the display substrate provided by at least one embodiment of the present disclosure, the first layer and the active layer of the driving transistor are in a same layer, the second layer and the gate electrode of the driving transistor are in a same layer and are made of a same material, and the third layer and the first electrode of the driving transistor are in a same layer and are made of a same material.

For example, in the display substrate provided by at least one embodiment of the present disclosure, the first layer comprises a first conductor portion on a first side of the second layer; the third layer is in direct contact with the first conductor portion through the signal line via hole on the first side of the second layer; and the third layer extends in the signal line via hole from the first side of the first conductor portion to a second side of the first conductor portion to contact at least part of an upper surface of the second layer away from the base substrate.

For example, in the display substrate provided by at least one embodiment of the present disclosure, the third layer is in direct contact with the upper surface of the second layer away from the base substrate and a side surface of the second layer intersecting the upper surface of the second layer, and the third layer is in direct contact with the first layer.

For example, in the display substrate provided by at least one embodiment of the present disclosure, the first layer further comprises a second conductor portion which is on a second side of the second layer in a line width direction of the signal line, wherein the second side of the second layer is opposite to the first side of the second layer, the third layer extends in the signal line via hole from the first side of the second layer along the line width direction of the signal line, across over the second layer, to the second side of the second layer, and the third layer is in direct contact with the second conductor portion through the signal line via hole on the second side of the second layer.

For example, in the display substrate provided by at least one embodiment of the present disclosure, the first layer further comprises a semiconductor portion which is overlapped with the second layer in a direction perpendicular to the base substrate, in a same layer as the active layer of the driving transistor, and constitutes an integrated structure with the first conductor portion.

For example, the display substrate provided by at least one embodiment of the present disclosure further comprises a data line which is connected to the second electrode of the data writing transistor and configured to provide a data signal to the data writing transistor, wherein the signal line comprises the data line.

For example, the display substrate provided by at least one embodiment of the present disclosure further comprises a first power line which is configured to provide a first power voltage to the first electrode of the driving transistor, wherein the signal line comprises the first power line.

At least one embodiment of the present disclosure further provides a display apparatus, the display apparatus comprises any one of the display substrates provided by embodiments of the present disclosure.

At least one embodiment of the present disclosure further provides a manufacture method of a display substrate, the manufacture method comprises: providing a base substrate; forming a plurality of pixels on the base substrate, in which at least part of the plurality of pixels comprises a plurality of sub-pixels, each of the plurality of sub-pixels comprise a light-emitting device and a pixel circuit configured to drive the light-emitting device to emit light, the pixel circuit comprises a light-emitting device, a storage capacitor, a driving transistor and a data writing transistor, each of the driving transistor and the data writing transistor comprises an active layer, a gate electrode, a first electrode and a second electrode; the first electrode of the driving transistor is configured to receive a first power voltage, and the second electrode of the driving transistor is connected to the light-emitting device to control the light-emitting device to emit light; and forming a first via hole in at least part of the plurality of sub-pixels, in which the first electrode of the data writing transistor is electrically connected to the gate electrode of the driving transistor and the active layer of the data writing transistor through the first via hole.

For example, the display substrate provided by at least one embodiment of the present disclosure comprises: forming a semiconductor layer; forming a gate insulation layer covering the semiconductor layer on a side of the semiconductor layer away from the base substrate; forming a gate conductive layer on a side of the gate insulation layer away from the base substrate; patterning the gate conductive layer through a patterning process to form a gate electrode of the driving transistor; performing a patterning process on the gate insulation layer, with the gate electrode of the driving transistor as an etching barrier layer, to expose a portion of the semiconductor layer, in which the semiconductor layer comprises a portion shielded by the gate insulation layer and a portion not shielded by the gate insulation layer; and performing a conducting process on the portion of the semiconductor layer not shielded by the gate insulation layer to form a first conductive portion, in which the portion shielded by the gate insulation layer is not conducted to form the active layer of the driving transistor and a connection portion, the gate electrode of the driving transistor comprises a main portion and an extension portion connected to the main portion, a projection of the main portion is overlapped with a projection of the active layer of the driving transistor, the extension portion extends from the main portion, and the extension portion is electrically connected to the gate electrode of the driving transistor and the active layer of the data writing transistor through the first via hole; the connection portion and the extension portion are overlapped in a direction perpendicular to the base substrate, and the extension portion connects the first conductive portion with the active layer of the data writing transistor; the connection portion, the first conductive portion and the active layer of the data writing transistor constitute an integrated structure.

For example, in the display substrate provided by at least one embodiment of the present disclosure, forming the first via hole comprises: after forming the active layer of the driving transistor and the active layer of the data writing transistor, forming a first insulation layer on a side of the gate electrode of the driving transistor away from the base substrate, in which the first insulation layer covers the gate electrode of the driving transistor, the gate electrode of the data writing transistor and the gate insulation layer; and performing a patterning process on the first insulation layer to form the first via hole, in which the first via hole exposes at least part of the gate electrode of the driving transistor and at least part of the first conductive portion; the manufacture method further comprises: forming a second conductive portion on a side of the gate electrode of the driving transistor away from the base substrate, in which the second conductive portion is electrically connected to the gate electrode of the driving transistor and the first conductive portion through the first via hole, and the first conductive portion and the second conductive portion constitute the first electrode of the data writing transistor.

For example, the display substrate provided by at least one embodiment of the present disclosure further comprises: forming a signal line, and forming a signal line comprises forming a first layer, a second layer and a third layer that are stacked sequentially in a direction perpendicular to the base substrate and away from the base substrate, in which the first layer is spaced apart from the third layer, the signal line further comprises a signal line via hole, and the third layer is electrically connected to the second layer and the first layer through the signal line via hole.

For example, in the display substrate provided by at least one embodiment of the present disclosure, the first layer and the active layer of the driving transistor are formed simultaneously by performing a same conducting process on the portion, not shielded by the gate insulation layer, of the semiconductor layer; the second layer and the gate electrode of the driving transistor are formed simultaneously by performing a same patterning process on the gate conductive layer; and the third layer and the first electrode of the driving transistor are formed simultaneously by performing a same patterning process on a same film.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
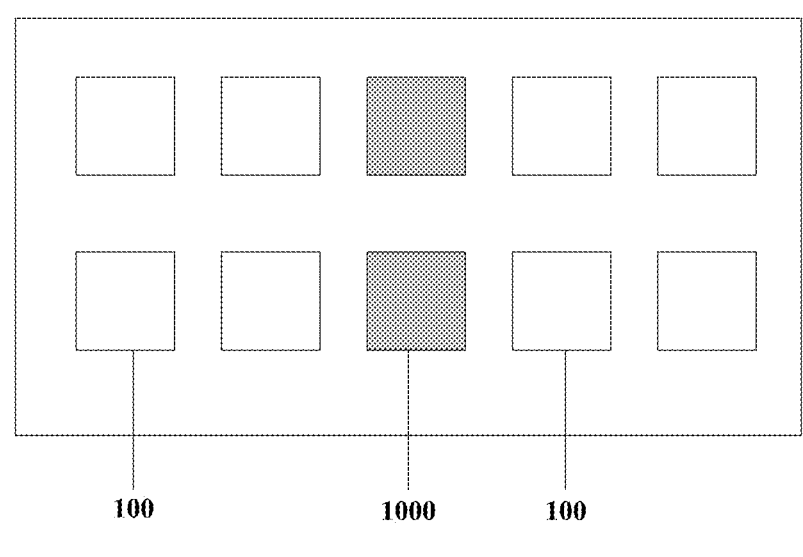
FIG. 1 is a schematic diagram of a display substrate provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Inside," "outside", "on," "under," and the like are only used to indicate relative position relationship, and when the position of the object which is described is changed, the relative position relationship may be changed accordingly.

The drawings in the present disclosure are not drawn strictly according to the actual scale, the number of pixels in the display substrate and the number of sub-pixels in each pixel are not limited to the number shown in the drawings, and the specific size and number of each structure can be determined according to the actual needs. The drawings described in the present disclosure are only structural diagrams.

At least one embodiment of the present disclosure provides a display substrate, the display substrate comprises a base substrate, the base substrate is provided with a plurality of pixels in an array, at least part of the plurality of pixels comprise a plurality of sub-pixels, at least part of the plurality of sub-pixels comprises a light-emitting device and a pixel circuit configured to drive the light-emitting device to emit light, and the pixel circuit comprises a storage capacitor, a driving transistor and a data writing transistor, the driving transistor comprises an active layer, a gate electrode, a first electrode and a second electrode, the data writing transistor comprises an active layer, a gate electrode, a first electrode and a second electrode; the first electrode of the driving transistor is configured to receive a first power voltage, and the second electrode of the driving transistor is connected to the light-emitting device to control the light-emitting device to emit light; at least part of the plurality of sub-pixels comprises a first via hole, and the first electrode of the data writing transistor is electrically connected to the gate electrode of the driving transistor and the active layer of the data writing transistor through the first via hole.

In the display substrate provided by the embodiments of the present disclosure, the first electrode of the data writing transistor is electrically connected to the gate electrode of the driving transistor and the active layer of the data writing transistor through only the first via hole, compared with other connection manners, the contact resistance at the connection position is significantly reduced, the signal transmission efficiency is improved, and the manufacture process of the display substrate is simplified.

For example, FIG. 1 is a schematic diagram of a display substrate provided by at least one embodiment of the present disclosure. As shown in FIG. 1, the display substrate 10 includes a plurality of pixels 100 arranged in an array, at least part of the pixels 100 includes a plurality of sub-pixels, at least part of the sub-pixels includes a light-emitting device and a pixel circuit configured to drive the light-emitting device to emit light, the pixel circuit includes a storage capacitor, a driving transistor and a data writing transistor, the driving transistor includes an active layer, a gate electrode, a first electrode and a second electrode, and the data writing transistor comprises an active layer, a gate electrode, a first electrode and a second electrode. The first electrode of the driving transistor is configured to receive a first power voltage, and the second electrode of the driving transistor is connected to a light-emitting device to control the light-emitting device to emit light. For example, part of the pixels in the plurality of pixels 100 are dummy pixels 101, the dummy pixels 1000 do not participate in the display operation, and each dummy pixel 1000 includes a plurality of dummy sub-pixels rather than sub-pixels playing a display driving role. For example, the display substrate 10 is an organic light-emitting diode (OLED) display substrate, and the light-emitting device is an OLED. The display substrate 10 may further include a plurality of scan lines and a plurality of data lines configured to provide scan signals (control signals) and data signals for the plurality of sub-pixels to drive the plurality of sub-pixels. As required, the display substrate 10 may further include a power line, a detection line, etc.

The pixel circuit includes a driving sub-circuit configured to drive the light-emitting device to emit light and a detection sub-circuit configured to detect electrical characteristics of the sub-pixel to realize external compensation. The embodiments of the present disclosure do not limit the specific structure of the pixel circuit.

Figure 2A:
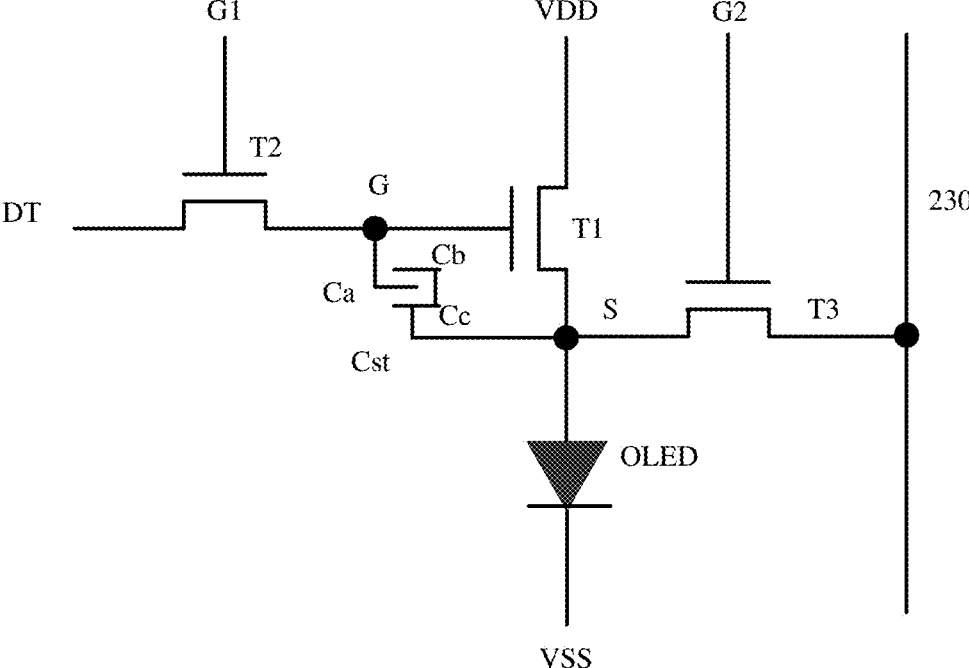
FIG. 2A is a pixel circuit diagram of a display substrate provided by at least one embodiment of the present disclosure.

For example, FIG. 2A shows a schematic diagram of a 3T1C pixel circuit used in the display substrate. The pixel circuit of the display substrate provided by the embodiments of the present disclosure is not limited to the 3T1C pixel circuit. The embodiments take the pixel circuit of the display substrate 10 being the 3T1C pixel circuit as an example to illustrate the structure of the display substrate. As required, the pixel circuit may further include a compensation circuit, a reset circuit, etc., which is not limited by the embodiments of the present disclosure.

Referring to FIG. 2A, the pixel circuit includes a first transistor T1, a second transistor T2, a third transistor T3, and a storage capacitor Cst. The first transistor T1 is the driving transistor described in the present application, and the second transistor T2 is the data writing transistor described in the present application. The first electrode of the second transistor T2 is electrically connected to the first capacitor electrode Ca of the storage capacitor Cst and the gate electrode of the first transistor T1, the second electrode of the second transistor T2 is configured to receive a data signal DT, and the second transistor T2 is configured to write the data signal DT to the gate electrode of the first transistor T1 and the storage capacitor Cst in response to a first control signal G1; the first electrode of the first transistor T1 is electrically connected to the second capacitor electrode Cb of the storage capacitor Cst and is configured to be electrically connected to the first electrode of the light-emitting device, the second electrode of the first transistor T1 is configured to receive a first power voltage V1 (for example, a high power voltage VDD), the first transistor T1 is configured to control the current for driving the light-emitting device under the control of the voltage of the gate electrode of the first transistor T1; the first electrode of the third transistor T3 is electrically connected to the first electrode of the first transistor T1 and the second capacitor electrode Cb of the storage capacitor Cst, and the second electrode of the third transistor T3 is configured to be connected to a detection line 230 to be connected to an external detection circuit 21, the third transistor T3 is configured to detect electrical characteristics of the sub-pixel in response to a second control signal G2 to achieve external compensation; the electrical characteristics include, for example, the threshold voltage and/or carrier mobility of the first transistor T1, or the threshold voltage and driving current of the light-emitting device, etc. The external detection circuit 21 is, for example, a conventional circuit such as a digital to analog converter (DAC), an analog to digital converter (ADC), or the like, which is be described in detail in the embodiments of the present disclosure.

Figure 3A:
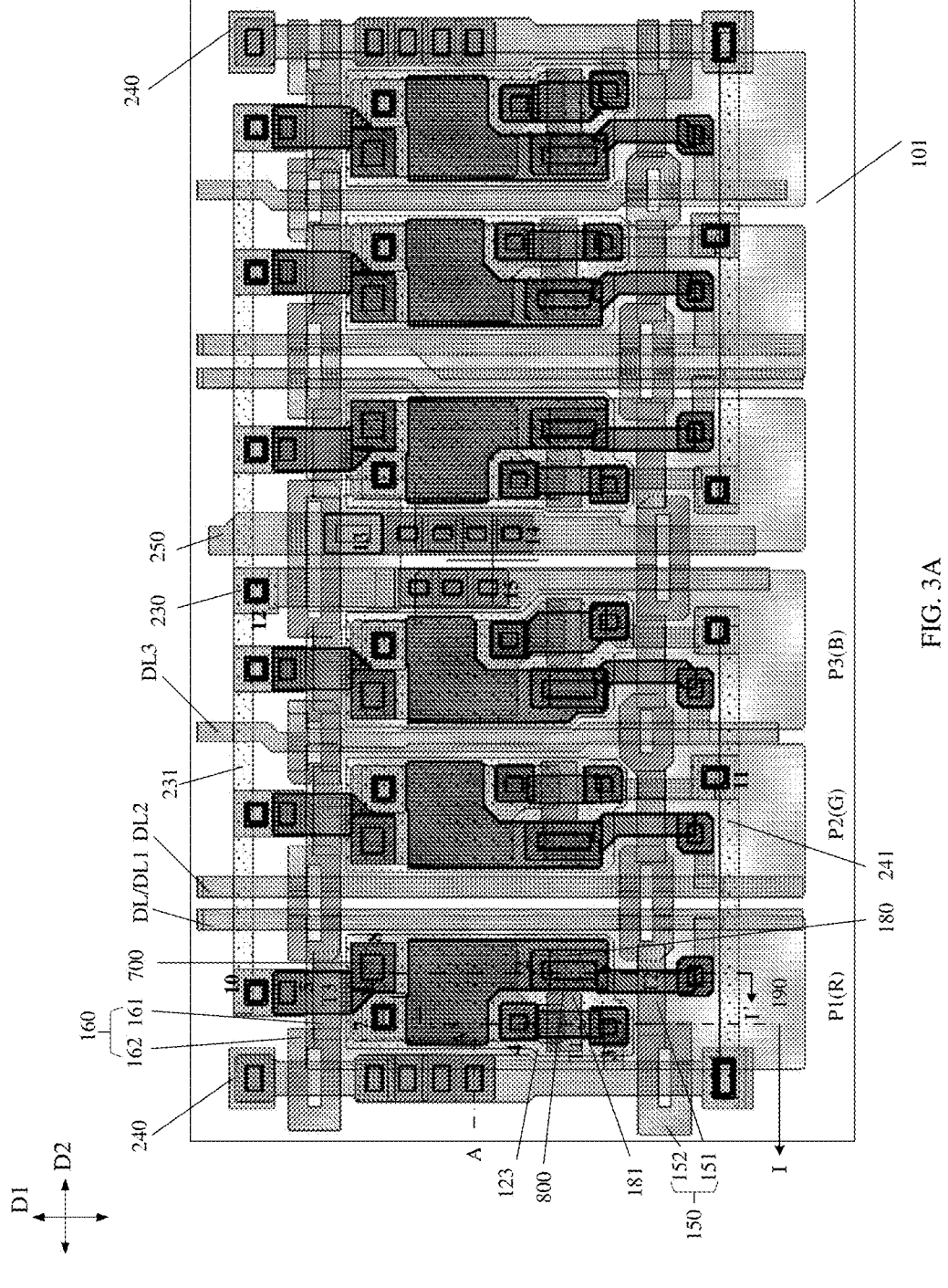
FIG. 3A is a structural diagram of a sub-pixel of a display substrate provided by at least one embodiment of the present disclosure.

For example, the storage capacitor Cst shown in FIG. 2A further includes a third capacitor electrode Cc, the third capacitor electrode Cc is located on a side of the first capacitor electrode Ca away from the second capacitor electrode Cb and is electrically connected to the second capacitor electrode Cb through the No. 7 via hole shown in FIG. 3A, so as to form a parallel capacitor structure to increase the capacitance value of the storage capacitor Cst. For example, in a direction perpendicular to the base substrate 101, the third capacitor electrode Cc, the second capacitor electrode Cb and the first capacitor electrode Ca are overlapped with each other.

The transistors used in the embodiments of the present disclosure may be thin-film transistors, field effect transistors or other switch devices with the same characteristics. The embodiments of the present disclosure take the case that transistors are all thin-film transistors as examples. The source electrode and drain electrode of the transistor used here may be symmetrical in structure, so there may be no difference in structure between the source electrode and the drain electrode. In the embodiments of the present disclosure, in order to distinguish the two electrodes of the transistor other than the gate electrode, it is directly described that one electrode is the first electrode and the other electrode is the second electrode. In addition, according to the characteristics of transistors, transistors can be divided into n-type transistors and p-type transistors. In the case that a transistor is a p-type transistor, the turn-on voltage is a low-level voltage (e.g., 0V, −5V, −10V or other suitable voltage), and the turn-off voltage is a high-level voltage (e.g., 5V, 10V or other suitable voltage); in the case that a transistor is an n-type transistor, the turn-on voltage is a high-level voltage (e.g., 5V, 10V or other suitable voltage), and the turn-off voltage is a low-level voltage (e.g., 0V, −5V, −10V or other suitable voltages). It should be noted that in the following description, the case that the transistors in FIG. 2A are all n-type transistor is taken as an example, but it is not a limitation of the present disclosure.

Figure 2B:
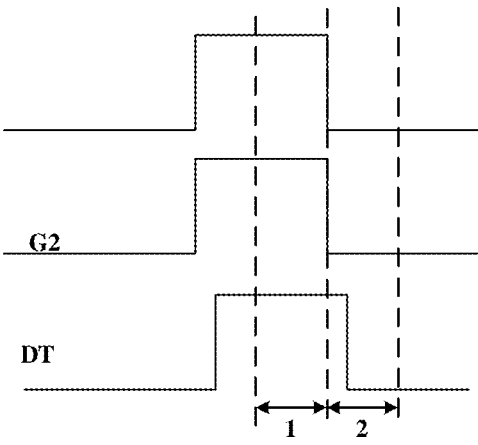
FIGS. 2B-2D are signal timing diagrams of a driving method of a pixel circuit provided by embodiments of the present disclosure.
Figure 2C:
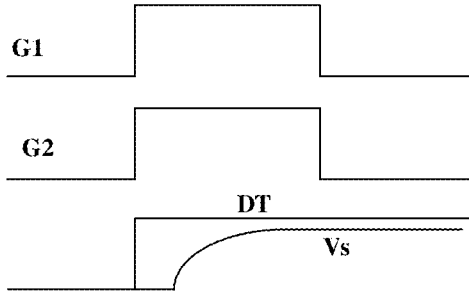
Figure 2D:
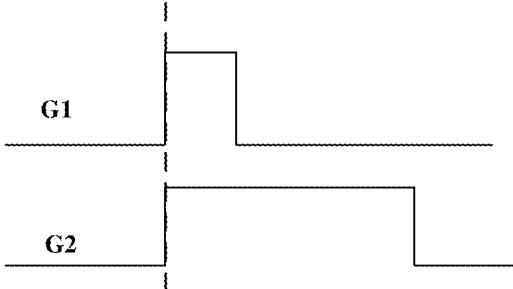

In the following, the working principle of the pixel circuit shown in FIG. 2A is described in combination with the signal timing diagrams shown in FIG. 2B-FIG. 2D, FIG. 2B shows the signal timing diagram of the pixel circuit in the display process, and FIG. 2C and FIG. 2D show the signal timing diagrams of the pixel circuit in the detection process.

For example, as shown in FIG. 2B, the display process of each frame image includes a data writing and reset phase 1 and a light emission phase 2. FIG. 2B shows a timing waveform of each signal in each phase. The working process of the 3T1C pixel circuit includes the following stages: in the data writing and reset phase 1, the first control signal G1 and the second control signal G2 are turn-on signals, the second transistor T2 and the third transistor T3 are turned on, the data signal DT is transmitted to the gate electrode of the first transistor T1 through the second transistor T2, and the first switch K1 is turned off, the analog to digital converter writes a reset signal to the first electrode of the light-emitting device (such as the anode of the OLED) through the detection line 230 and the third transistor T3, and the first transistor T1 is turned on and generates a driving current to charge the first electrode of the light-emitting device to the working voltage; in the light emission phase 2, both the first control signal G1 and the second control signal G2 are turn-off signals. Because of the bootstrap effect of the storage capacitor Cst, voltages at two ends of the storage capacitor Cst remain unchanged, the first transistor T1 operates in the saturated state and the current remains unchanged, and the light-emitting device is driven to emit light.

For example, FIG. 2C shows a signal timing diagram of the pixel circuit when detecting the threshold voltage. One working process of the 3T1C pixel circuit includes the following stages: the first control signal G1 and the second control signal G2 are turn-on signals, the second transistor T2 and the third transistor T3 are turned on, and the data signal DT is transmitted to the gate electrode of the first transistor T1 through the second transistor T2; the first switch K1 is turned off, the analog to digital converter writes a reset signal to the first electrode (the node S) of the light-emitting device through the detection line 230 and the third transistor T3. The first transistor T1 is turned on and charges the node S until the first transistor is turned off. The digital to analog converter samples the voltage on the detection line 230 to obtain the threshold voltage of the first transistor T1. This process can be carried out, for example, when the display apparatus is turned off.

For example, FIG. 2D shows a signal timing diagram of the pixel circuit when detecting carrier mobility. One working process of the 3T1C pixel circuit includes the following stages: in the first phase, both the first control signal G1 and the second control signal G2 are turn-on signals, the second transistor T2 and the third transistor T3 are turned on, and the data signal DT is transmitted to the gate electrode of the first transistor T1 through the second transistor T2; the first switch K1 is turned off, and the analog to digital converter writes a reset signal to the first electrode (the node S) of the light-emitting device through the detection line 230 and the third transistor T3; in the second phase, the first control signal G1 is the turn-off signal, the second control signal G1 is the turn-on signal, the second transistor T2 is turned off, the third transistor T3 is turned on, and the first switch K1 and the second switch K2 are turned off to float the detection line 230; because of the bootstrap effect of the storage capacitor Cst, voltages at two ends of the storage capacitor Cst remain unchanged, the first transistor T1 works in a saturated state and the current remains unchanged, and the light-emitting device is driven to emit light, and then the digital to analog converter samples the voltage on the detection line 230, and calculating the carrier mobility in the first transistor T1 combined with the magnitude and duration of the light-emitting current. For example, this process can be performed in the blanking phase between display phases.

Through the above detection, the electrical characteristics of the first transistor T1 can be obtained and the corresponding compensation algorithm can be realized.

For example, the display substrate 10 may further include a data driving circuit and a scan driving circuit (not shown).

The data driving circuit is configured to send a data signal, such as the above data signal DT, as required (for example, an image signal input to the display apparatus); the pixel circuit of each sub-pixel is further configured to receive the data signal and apply the data signal to the gate electrode of the first transistor. The scan driving circuit is configured to output various scan signals including, for example, the first control signal G1 and the second control signal G2, the scan driving circuit is, for example, an integrated circuit chip (IC) or a gate driving circuit (GOA) directly prepared on the display substrate.

For example, the display substrate 10 further includes a control circuit. For example, the control circuit is configured to control the data driving circuit to apply a data signal and control the gate driving circuit to apply a scan signal. An example of the control circuit is a timing control circuit (T-con). The control circuit can be in various forms, for example, the control circuit includes a processor and a memory, the memory includes executable codes, and the processor runs the executable codes to execute the above detection method.

For example, the processor may be a central processing unit (CPU) or other forms of processing devices with data processing capability and/or instruction execution capability, such as a microprocessor, a programmable logic controller (PLC), etc.

For example, the memory may include one or more computer program products, the computer program product may include various forms of computer-readable storage medium, such as a volatile memory and/or a non-volatile memory. The volatile memory may include, for example, a random access memory (RAM) and/or a cache, etc. The non-volatile memory may include, for example, a read-only memory (ROM), a hard disk, a flash memory, etc. One or more computer program instructions can be stored on the computer-readable storage medium, and the processor can run the program instructions to achieve desired functions. Various application programs and various data, such as electrical characteristic parameters obtained in the above detection method, can also be stored in the computer-readable storage medium.

FIG. 3A is a schematic diagram of sub-pixels of the display substrate 10 provided by at least one embodiment of the present disclosure. As shown in FIG. 3A, the display substrate 10 includes a base substrate 101, and a plurality of sub-pixels P1/P2/P3 are located on the base substrate 101. The plurality of sub-pixels P1/P2/P3 are distributed as a pixel array along a first direction D1 and a second direction D2. The pixel array includes a plurality of pixel columns and a plurality of pixel rows. The column direction of the pixel array is the first direction D1 and the row direction is the second direction D2. The first direction D1 intersects, for example, is orthogonal with, the second direction D2.

Figure 3B:
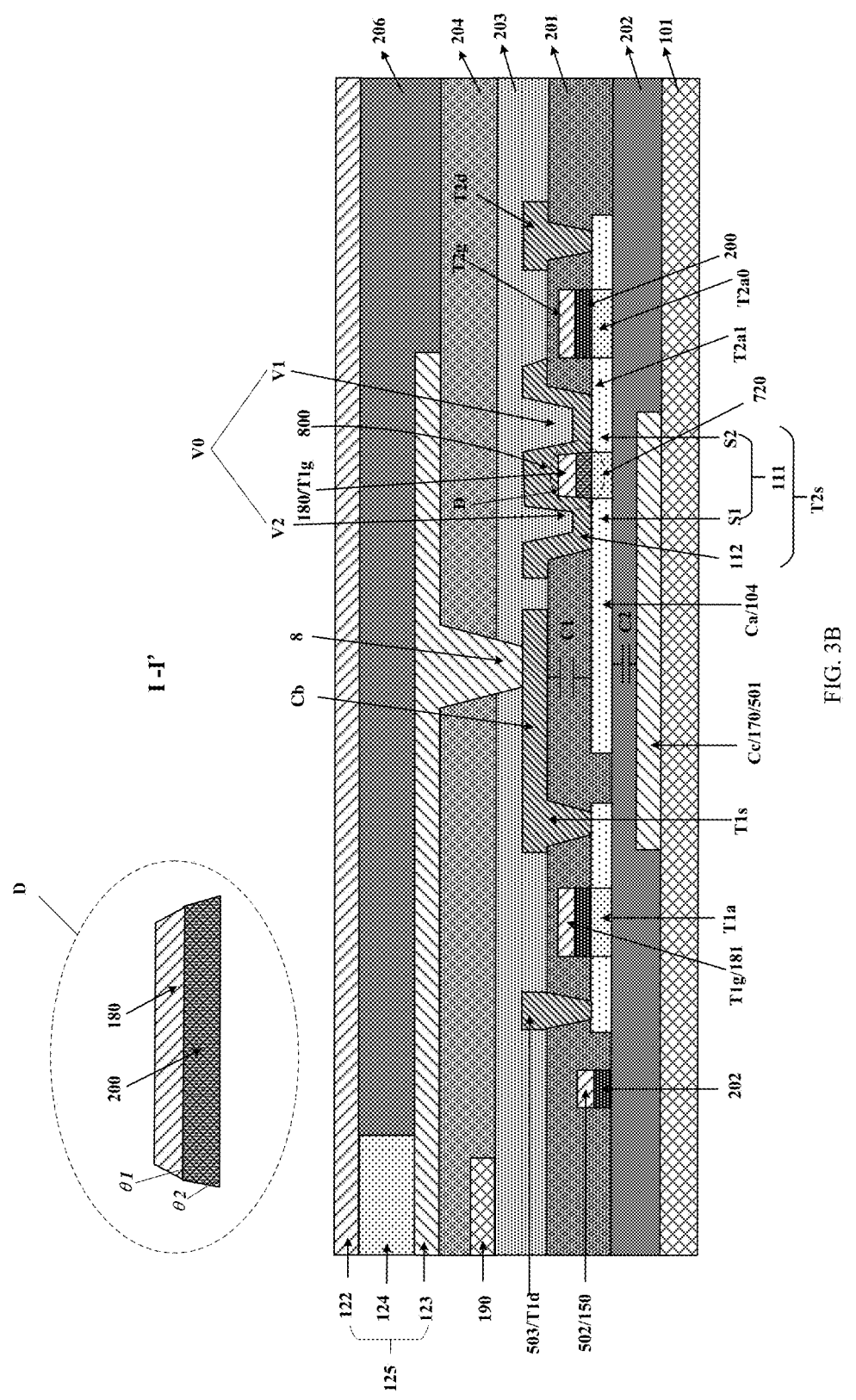
FIG. 3B is a cross-sectional diagram of FIG. 2A taken along a section line I-I '.

For example, sub-pixels of each pixel row are divided into a plurality of pixel units, and each pixel unit is configured to emit full-color light. FIG. 3A shows an exemplary pixel unit, but the embodiments of the present disclosure are not limited to this layout. FIG. 3B shows a cross-sectional diagram of FIG. 3A taken along a section line I-I'. As shown in FIG. 3A, the pixel unit includes a first sub-pixel P1, a second sub-pixel P2 and a third sub-pixel P3 sequentially arranged along the second direction D2. The first sub-pixel P1, the second sub-pixel P2 and the third sub-pixel P3 are respectively used to emit light of three basic colors (RGB); for example, the first sub-pixel P1 is a red sub-pixel, the second sub-pixel P2 is a blue sub-pixel, and the third sub-pixel P3 is a green sub-pixel.

Figure 4A:
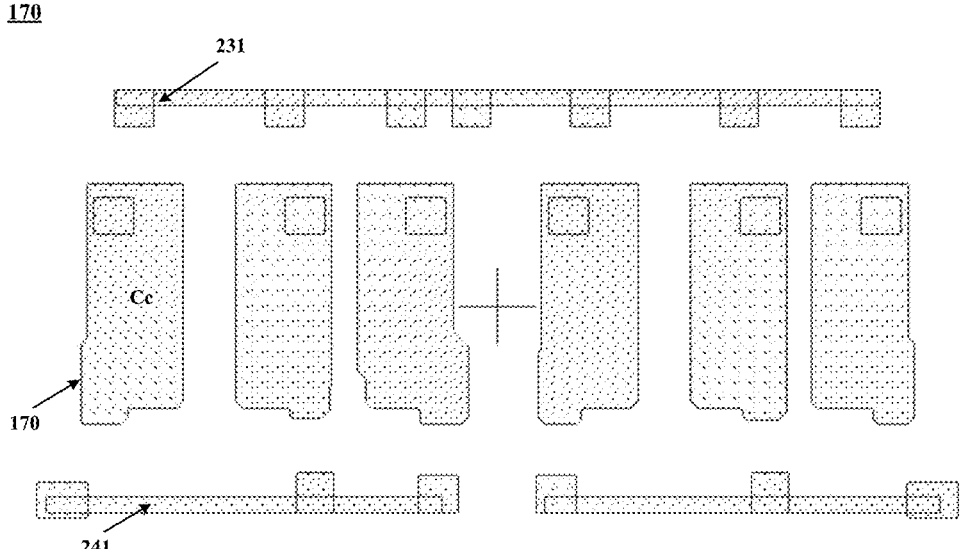
FIG. 4A is a schematic plan diagram of a first conductive layer in a display substrate provided by at least one embodiment of the present disclosure.
Figure 4B:
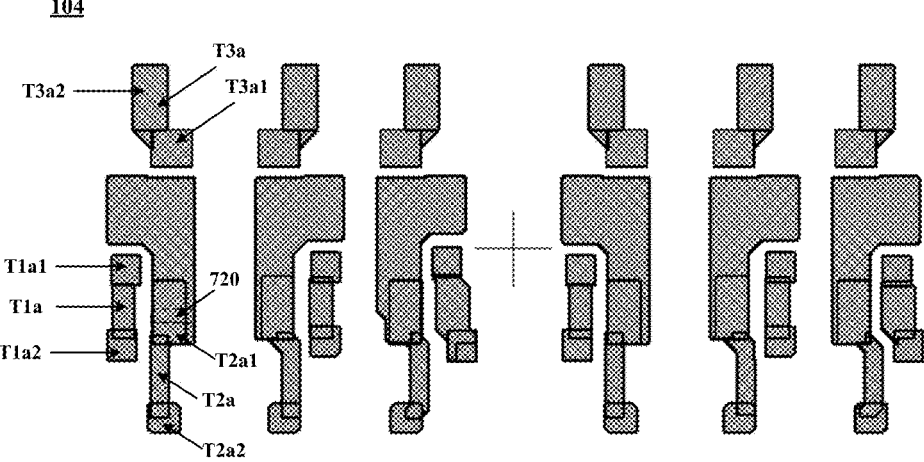
FIG. 4B is a schematic planar view of a semiconductor layer in a display substrate provided by at least one embodiment of the present disclosure.
Figure 4C:
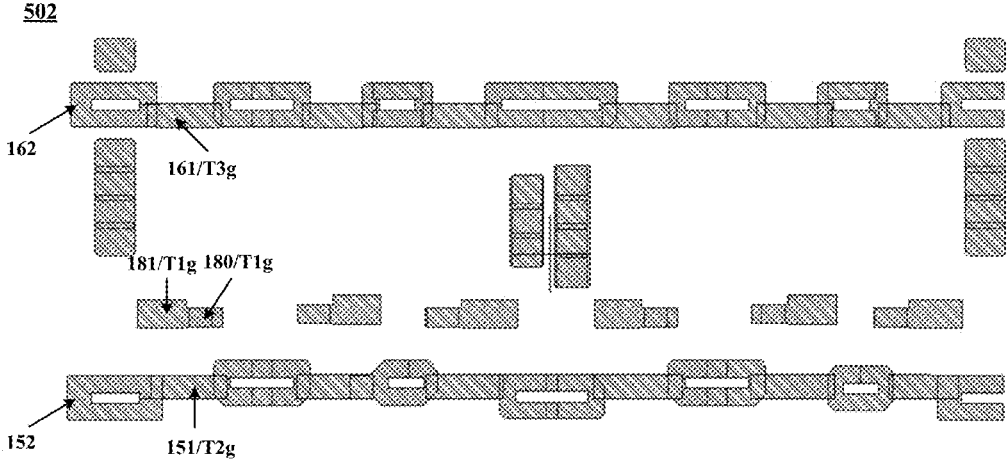
FIG. 4C is a schematic planar view of a second conductive layer in a display substrate provided by at least one embodiment of the present disclosure.
Figure 4D:
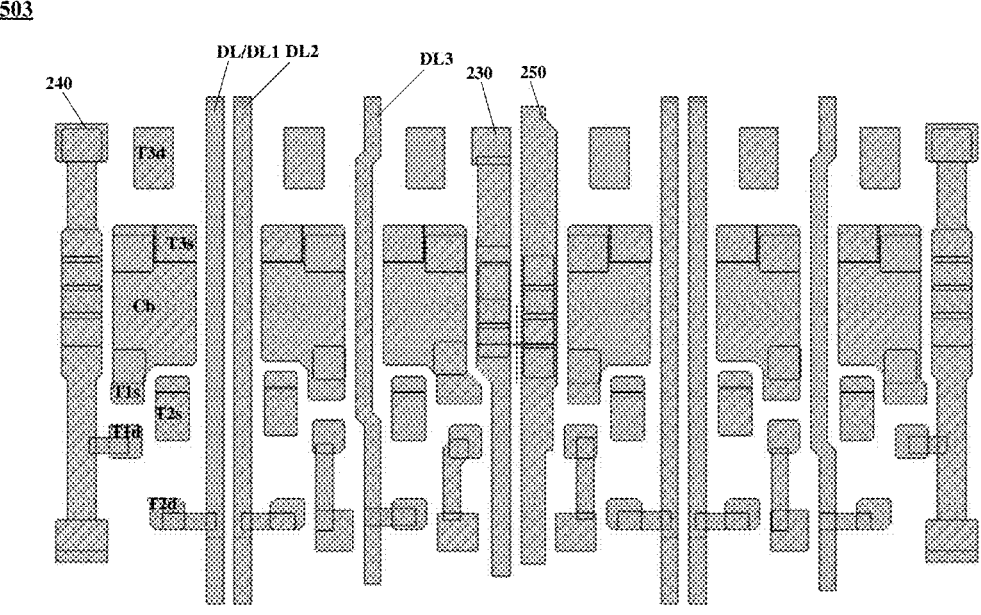
FIG. 4D is a schematic planar view of a third conductive layer in a display substrate provided by at least one embodiment of the present disclosure.
Figure 4E:
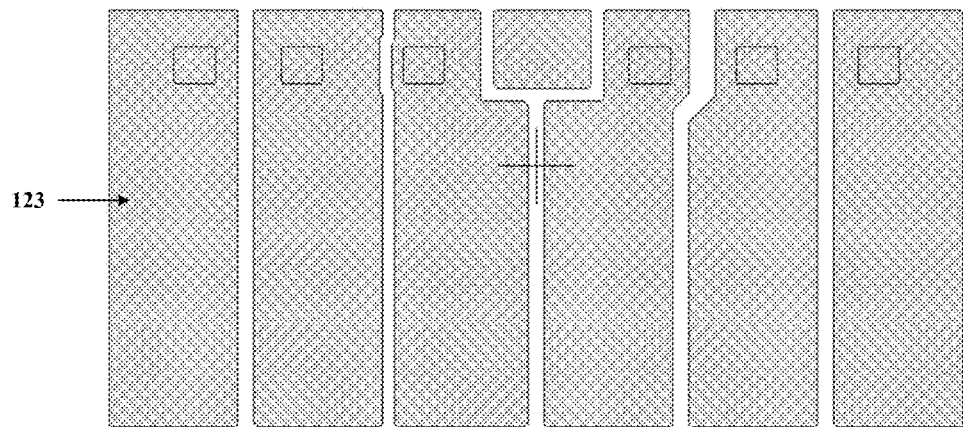
FIG. 4E is a schematic planar view of a first electrode in a display substrate provided by at least one embodiment of the present disclosure.
Figure 4F:
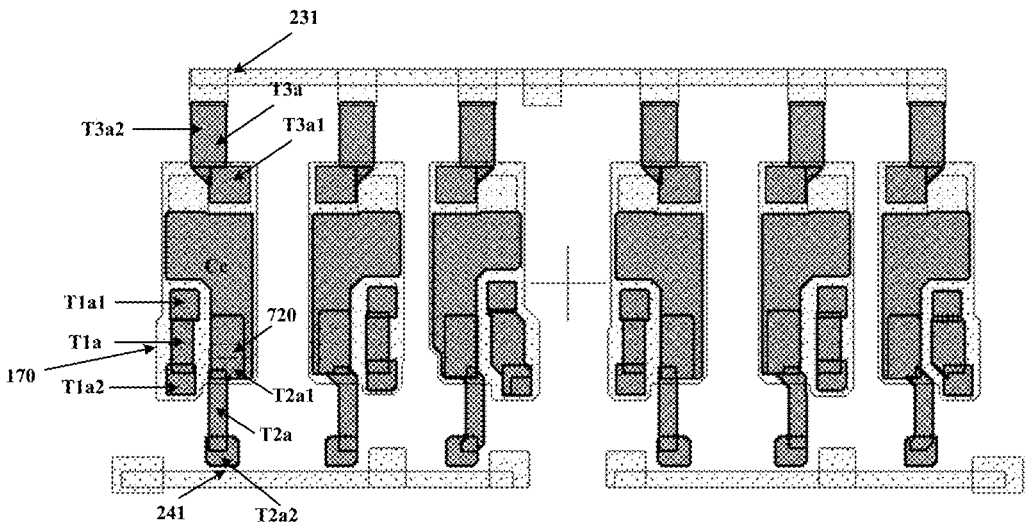
FIG. 4F is a schematic planar view of a stack of a first conductive layer and a semiconductor layer in a display substrate provided by at least one embodiment of the present disclosure.
Figure 4G:
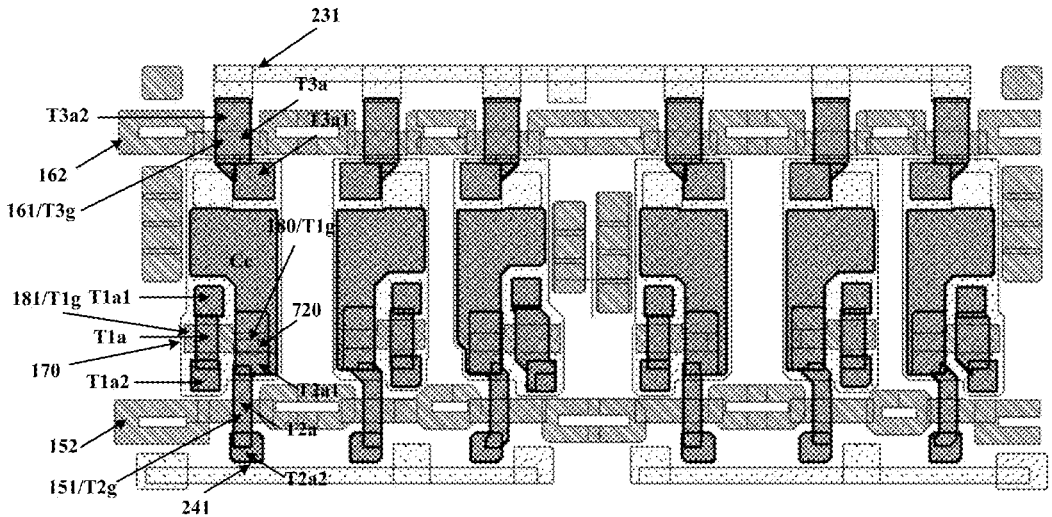
FIG. 4G is a schematic planar view of a stack of a first conductive layer, a semiconductor layer and a second conductive layer in a display substrate provided by at least one embodiment of the present disclosure.
Figure 4H:
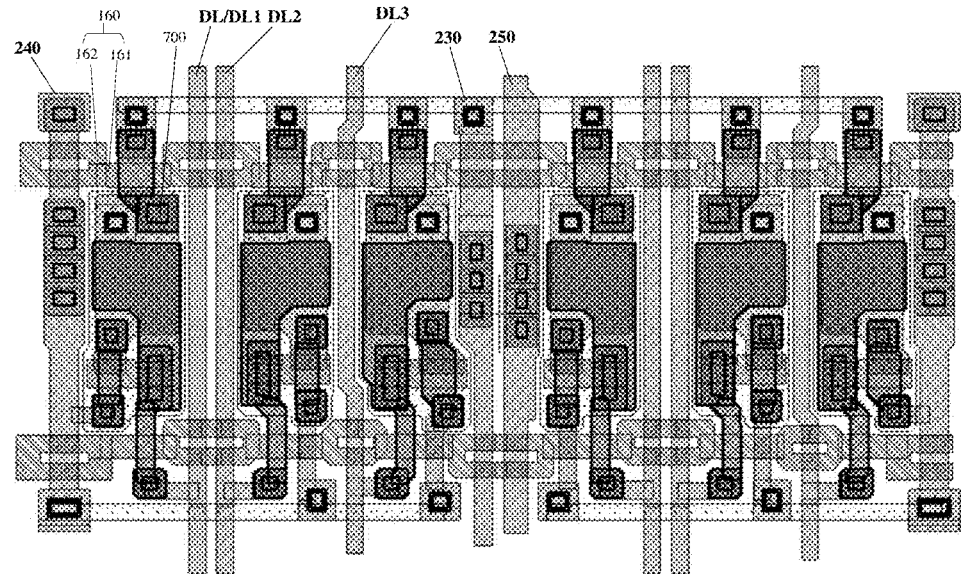
FIG. 4H is a schematic planar view of a stack of a first conductive layer, a semiconductor layer, a second conductive layer and a third conductive layer in a display substrate provided by at least one embodiment of the present disclosure.

FIG. 4A is a schematic plan diagram of a first conductive layer in the display substrate provided by at least one embodiment of the present disclosure; FIG. 4B is a schematic planar view of a semiconductor layer in the display substrate provided by at least one embodiment of the present disclosure; FIG. 4C is a schematic planar view of a second conductive layer in the display substrate provided by at least one embodiment of the present disclosure; FIG. 4D is a schematic planar view of a third conductive layer in the display substrate provided by at least one embodiment of the present disclosure; FIG. 4E is a schematic planar view of a first electrode in the display substrate provided by at least one embodiment of the present disclosure; FIG. 4F is a schematic planar view of a stack of a first conductive layer and a semiconductor layer in the display substrate provided by at least one embodiment of the present disclosure; FIG. 4G is a schematic planar view of a stack of a first conductive layer, a semiconductor layer and a second conductive layer in the display substrate provided by at least one embodiment of the present disclosure; and FIG. 4H is a schematic planar view of a stack of a first conductive layer, a semiconductor layer, a second conductive layer and a third conductive layer in the display substrate provided by at least one embodiment of the present disclosure. Referring to FIGS. 3A-3B and FIGS. 4A-4H, the display substrate 10 includes a first conductive layer 501, a second insulation layer 202, a semiconductor layer 104, a gate insulation layer 200, a second conductive layer 502, a first insulation layer 201, a third conductive layer 503 and a fourth conductive layer 504 that are sequentially arranged on the base substrate 101.

The specific structure of the sub-pixel of the display substrate 10 shown in FIG. 3A is described below. For convenience of explanation, in the following description, T1g, T1s, T1d and T1a are used to represent the gate electrode, the first electrode, the second electrode and the active layer of the first transistor T1; T2g, T2s, T2d and T2a are used to represent the gate electrode, the first electrode, the second electrode and the active layer of the second transistor T2; T3g, T3s, T3d and T3a are used to represent the gate electrode, the first electrode, the second electrode and the active layer of the third transistor T3; and Ca, Cb and Cc are used to represent the first capacitor electrode Ca, the second capacitor electrode Cb and the third capacitor electrode Cc of the storage capacitor Cst, respectively.

It should be noted that, the "in a/the same layer" in the present disclosure refers to that two (or more) structures are formed by the same deposition process and patterned by the same patterning process, and their materials may be the same or may be different. The "integrated structure" in the present disclosure refers to that two (or more) structures are formed by the same deposition process and patterned by the same patterning process to form structures that are connected to each other, and their materials may be the same or may be different.

For example, referring to FIGS. 3A-3B and FIG. 4A, the first conductive layer 501 includes a light shielding layer 170, and an orthographic projection of the light shielding layer 170 on the base substrate 101 covers an orthographic projection of the active layer T1a of the first transistor T1 on the base substrate 101. As the driving transistor of the pixel circuit, the stability of electrical characteristics of the first transistor T1 is very important for light-emitting characteristics of the light-emitting device. The light shielding layer 170 is an opaque layer, which can prevent light from the back of the base substrate 101 from entering the active layer of the first transistor T1 to avoid the drift of the threshold voltage of the first transistor T1, and therefore avoid affecting the light-emitting characteristics of the corresponding light-emitting device connected to the first transistor T1.

For example, the light shielding layer 170 includes an opaque conductive material, such as a metal or metal alloy material. This arrangement can alleviate the back channel phenomenon caused by the base substrate 101 capturing charge.

For example, referring to FIGS. 3A-3B and FIG. 4B, the semiconductor layer 104 includes an active layer T1a of the first transistor T1, an active layer T2a of the second transistor T2, and an active layer T3a of the third transistor T3.

For example, the semiconductor layer 104 further includes a first capacitor electrode Ca of the storage capacitor Cst, the first capacitor electrode Ca is obtained by performing a conducting process on the semiconductor layer 104; that is, the first capacitor electrode Ca is arranged in the same layer as the active layer T1a of the first transistor T1, the active layer T2a of the second transistor and the active layer T3a of the third transistor.

For example, referring to FIGS. 3A-3B and FIG. 4C, the second conductive layer 502 includes a gate electrode T1g of the first transistor T1, a gate electrode T2g of the second transistor T2, and a gate electrode T3g of the third transistor T3.

For example, the display substrate 10 adopts a self-aligning process, a conducting process (e.g., a doping process) is performed on the semiconductor layer 104 by using the second conductive layer 502 as a mask, so that the part of the semiconductor layer 104 not covered by the second conductive layer 502 is converted into conductive part, that is conductor, so as to obtain the first capacitor electrode Ca, and both the parts of the active layer of each transistor on two sides of the channel region are conductive to respectively constitute a first electrode contact region and a second electrode contact region, and the first electrode contact region and the second electrode contact region are respectively configured to be electrically connected to the first electrode and the second electrode.

For example, referring to FIGS. 3A-3B and FIG. 4D, the third conductive layer 503 includes the first electrode T1s and the second electrode T1d of the first transistor T1, the first electrode T2s and the second electrode T2d of the second transistor T2, and the first electrode T3s and the second electrode T3d of the third transistor T3.

For example, the third conductive layer 503 further includes the second capacitor electrode Cb of the storage capacitor Cst. For example, as shown in FIG. 3B, the second capacitor electrode Cb and the second electrode T1d of the first transistor T1 are arranged in the same layer and connected to each other to constitute an integrated structure. As shown in FIG. 3B, the first capacitor electrode Ca and the second capacitor electrode Cb are overlapped with each other in the direction perpendicular to the base substrate 101 to form the storage capacitor Cst.

For example, as shown in FIG. 3B, each sub-pixel further includes a light-emitting device 125. For example, the light-emitting device is an organic light-emitting diode, including a first electrode 123, a light-emitting layer 124 and a second electrode 122 stacked sequentially. For example, the light-emitting device 125 has a top emission structure, the first electrode is reflective, and the second electrode 122 is transmissive or semi-transmissive. For example, the first electrode includes a material with high work function to act as an anode, for example, the first electrode has an ITO/Ag/ITO stacked structure; the second electrode 122 includes a material with low work function to act as a cathode, for example, the second electrode 122 includes a semi-transmissive metal or metal alloy material, such as an Ag/Mg alloy material. Referring to FIGS. 3A-3B and FIG. 4E, the fourth conductive layer 504 includes the first electrode 123.

For example, as shown in FIG. 3B, the display substrate 10 further includes a third insulation layer 203 and a fourth insulation layer 204 that are between the third conductive layer 503 and the first electrode 123 of the light-emitting device. For example, the third insulation layer 203 is a passivation layer, such as an inorganic insulation layer, including, for example, oxides of silicon, nitride of silicon or oxynitride of silicon, such as silicon oxide, silicon nitride, silicon oxynitride, etc., the fourth insulation layer 204 includes an organic insulation material, such as polyimide (PI), acrylate, epoxy resin, polymethyl methacrylate (PMMA), or other organic insulation materials. For example, the fourth insulation layer 204 is a planarization layer.

For example, the display substrate 10 further includes a pixel definition layer 206 on the first electrode 123 of the light-emitting device 125, the pixel definition layer 206 includes an organic insulation material, such as polyimide (PI), acrylate, epoxy resin and polymethylmethacrylate (PMMA), or other organic insulation materials. The first electrode 123 of the light-emitting device 125 is electrically connected to the first electrode T1s of the first transistor T1 and the second capacitor electrode Cb through the No. 8 via hole, for example, the No. 8 via hole penetrates the third insulation layer 203 and the fourth insulation layer 204.

For example, the light-emitting device OLED in each sub-pixel is configured to emit white light, the display substrate 10 further includes a color film, and the white light is emitted through the color film to realize full-color display. For example, the light-emitting layer 124 may be formed on the whole surface of the base substrate with an open mask combined with an evaporation process, so that, for example, the patterning process for the light-emitting layer using a fine metal mask (FMM) is avoided, thereby avoiding limiting the resolution of the display substrate caused by the limited accuracy of FMM.

For example, the light-emitting device of the display substrate 10 provided by some embodiments of the present disclosure may adopt a bottom emission structure. For example, as shown in FIGS. 3A-3B, the color film is located on a side of the first electrode of the light-emitting device close to the base substrate 101, for example, between the third insulation layer 203 and the fourth insulation layer 204. The color film includes a plurality of color film portions 190 corresponding to a plurality of sub-pixels other than white sub-pixels, that is, each of the first sub-pixel P1, the second sub-pixel P2 and the third sub-pixel P3 respectively corresponds to a color film portion 190. The light emitted by the light-emitting devices of the first sub-pixel P1, the second sub-pixel P2 and the third sub-pixel P3 is emitted through the color film portions 190 to form display light.

For example, the sub-pixels shown in FIG. 3A are all sub-pixels participating in the display, and the dummy pixels are not shown. The dummy pixels can be set at appropriate positions of the display substrate according to actual needs. In combination with FIG. 3A and FIG. 3B, each sub-pixel includes a first via hole V0, and the first electrode T2s of the data writing transistor T2 is electrically connected to the gate electrode T1g of the driving transistor T1 and the active layer T2a of the data writing transistor T2 through the first via hole V0. It should be noted that the first via hole V0 is a through hole. Thus, in the display substrate 10 provided by the embodiments of the present disclosure, the first electrode T2s of the data writing transistor T2 is electrically connected to the gate electrode T1g of the driving transistor T1 and the active layer of the data writing transistor through the only one via hole which is the first via hole V0. Compared with other connection methods, the contact resistance at the connection position, where the first electrode T2s of the data writing transistor T2 is electrically connected to the gate electrode T1g of the driving transistor T1 and the active layer of the data writing transistor, is significantly reduced, the signal transmission efficiency is improved, and the manufacture process of display substrate is simplified.

FIG. 4B shows the first electrode contact region T1a1 and the second electrode contact region T1a2 of the active layer T1a of the first transistor T1, the first electrode contact region T2a1 and the second electrode contact region T2a2 of the active layer T2a of the second transistor T2, and the first electrode contact region T3a1 and the second electrode contact region T3a2 of the active layer T3a of the third transistor T3. The connection portion 720 is also shown in FIG. 4B.

For example, in combination with FIG. 3A and FIG. 3B, the gate electrode T1g of the driving transistor T1 includes a main portion 181 and an extension portion 180 connected to the main portion 181. An orthographic projection of the main portion 181 on the base substrate 101 is overlapped with an orthographic projection of the active layer T1a of the driving transistor on the base substrate 101, and the extension portion 180 extends from the main portion 181, the extension portion 180 is electrically connected to the first electrode T2s of the data writing transistor T2 and the active layer T2a of the data writing transistor through the first via hole V0. The first via hole V0 includes a first region V1 and a second region V2 that are communicated with each other. For example, the extension portion 180 is in direct contact with the first electrode T2s of the data writing transistor T2 through the first region V1 of the first via hole V0 and the second region V2 of the first via hole V0 to be electrically connected to the first electrode T2s of the data writing transistor T2; the extension portion 180 is connected to the first electrode contact region T2a1 of the active layer T2a of the second transistor T2 through the first region V1 of the first via hole V0. As shown in FIG. 4B, the first electrode contact region T2a1 is in direct contact with the active layer T2a of the second transistor T2 for electrical connection, so that the extension portion 180 is electrically connected to the active layer T2a of the data writing transistor through the first via hole V0.

For example, as shown in FIG. 3B, the first electrode T2s of the data writing transistor T2 includes a first conductive portion 111 and a second conductive portion 112 that are stacked with each other in the direction perpendicular to the base substrate 101, and the second conductive portion 112 is located on a side of the first conductive portion 111 away from the base substrate 101. The gate electrode T1g of the driving transistor T1 is located on a side of the first conductive portion 111 close to the second conductive portion 112 and spaced apart from the first conductive portion 111. The second conductive portion 112 contacts the gate electrode T1g of the driving transistor T1 and the first conductive portion 111 through the first via hole V0 to reduce the contact resistance. The display substrate 10 further includes a connection portion 720, the connection portion 720 is overlapped with the extension portion 180 in a direction perpendicular to the base substrate 101, and the connection portion 720 connects the first conductive portion 111 with the active layer T2a of the data writing transistor T2 (for example, the channel region T2a0 of the second transistor T2), and the connection portion 720, the first conductive portion 111 and the active layer T2a of the data writing transistor T2 constitute an integrated structure. For example, the connection portion 720 contacts the first conductive portion 111, and the connection portion 720 is electrically connected to the channel region T2a0 of the second transistor T2 via the first electrode contact region T2a1.

It should be noted that the term "the connection portion 720, the first conductive portion 111 and the active layer T2a of the data writing transistor T2 constitute an integrated structure" means that there is no gap between any two of the three and there are no other layers or structures between any two of the three, but the materials of the first conductive portion 111 and the active layer T2a are different. For example, as described above, in the process of preforming a conducting process on the semiconductor layer 104 by using the second conductive layer 502 as a mask, the first conductive portion 111 and the first electrode contact region T2a1 belong to the portion of the semiconductor layer 104 not covered by the second conductive layer 502 are conductive, and the connection portion 720 and the channel region T2a0 of the second transistor T2 belong to the portion covered by the second conductive layer 502 are not conductive, so materials of the first conductive portion 111 and the active layer T2a of the data writing transistor T2 are different. In this way, the mask for forming the active layer through the patterning process can be saved, and the manufacture process can be simplified. Thus, the material of the second conductive portion 112 and the material of the connection portion 180 include the same semiconductor material, and the semiconductor material included in the first conductive portion 111 is converted into a conductive material.

For example, the conducting process may be a plasma treatment process performed on the semiconductor layer by using plasma, or may be a doping process, etc., for the specific process type, reference may be made to conventional techniques in the art, which is not limited in the present disclosure. For example, the above semiconductor material is IGZO. For example, a gas containing H+ is used to treat the surface of IGZO to combine the oxygen in IGZO with H+, and with the continuous reaction with the conductive gas, the IGZO that is not covered by the second conductive layer becomes conductive.

For example, as shown in FIG. 3B, the first conductive portion 111 includes a first sub-portion S1, and the first sub-portion S1 is located on the first side of the extension portion 180; the second conductive portion 112 is in direct contact with the first sub-part S1 on the first side of the extension portion 180 through the via hole V0. The second conductive portion 112 extends in the first via hole V0 from the first side of the extension portion 180 to the extension portion 180 to contact at least a part of the upper surface of the extension portion 180 away from the base substrate 101. For example, the second conductive portion 112 is in contact with the position of the upper surface of the extension portion 180 over the entire width of the extension portion 180 in the first direction D1. In this way, the contact resistance of the electrical connection between the first conductive portion 111, the extension portion 180, and the second conductive portion 112 can be further reduced, and the signal transmission efficiency can be improved.

For example, the first conductive portion 111 further includes a second sub-portion S2, the second sub-portion S2 is located on the second side of the extension portion 180, and the second side of the extension portion 180 is opposite to the first side of the extension portion 180; the second conductive portion 112 extends in the first via hole V0 from the first side of the extension portion 180 to the extension portion 180, and extends across over the extension portion 180 to extend to the second side of the extension portion 180, and the second conductive portion 112 is in direct contact with the second sub-portion S2 through the first via hole V0 on the second side of the extension portion 180, so as to further reduce the contact resistance of the electrical connection between the first conductive portion 111, the extension portion 180 and the second conductive portion 112, and improve the signal transmission efficiency.

For example, the gate insulation layer 200 is located between the gate electrode T1g of the driving transistor T1 and the active layer T1a of the driving transistor T1, and the gate electrode T1g of the driving transistor T1 is located on a side of the gate insulation layer 200 away from the base substrate 101; the second insulation layer 202 is located on a side of the gate electrode T1g of the driving transistor T1 away from the base substrate 101, and the first via hole V0 penetrates the gate insulation layer 200 and the second insulation layer 202.

Figure 3C:
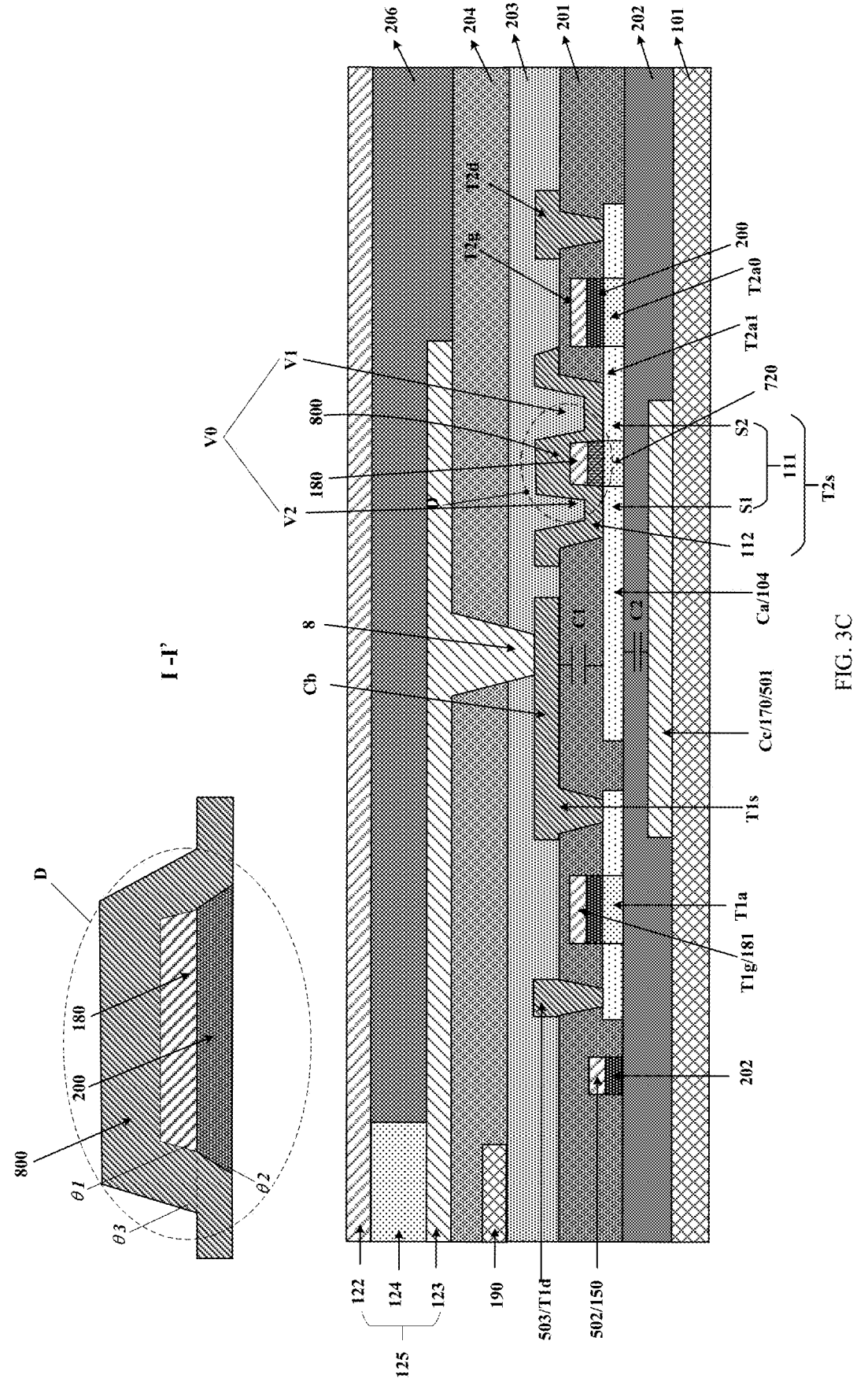
FIG. 3C is another cross-sectional diagram of FIG. 2A taken along the section line I-I'.

Referring to the enlarged schematic diagram of the region D in FIG. 3B. The extension portion 180 includes a side surface intersecting the upper surface, and the second conductive portion 112 further covers the side surface of the extension portion and is in contact with the side surface of the extension portion 180; the gate insulation layer 200 includes an upper surface and a side surface intersecting the upper surface of the gate insulation layer. The included angle, close to the extension portion 180, in included angles between the side surface of the extension portion 180 and the plane where the upper surface of the extension portion 180 is located is a first included angle θ1, and the included angle, close to the extension portion 180, in included angles between the side surface of the gate insulation layer 200 and the plane where the upper surface of the extension portion 180 is located is a second included angle θ2. For example, the first included angle θ1 is smaller than the second included angle θ2, that is, the slope angle of the side surface of the extension portion 180 is smaller than the slope angle of the side surface of the gate insulation layer 200, which is beneficial to improve the contact reliability between the second conductive portion 112 and the extension portion 180, to ensure the reliability of the electrical connection and the stability of the electrical connection between the two. For another example, FIG. 3C is another cross-sectional diagram of FIG. 2A taken along the section line II'. In the embodiment shown in FIG. 3C, the second conductive portion 112 includes a middle portion 800 that directly contacts the extension portion 180. The included angle, close to the extension portion 180, in included angles between the side surface of the middle portion 800 and the plane where the upper surface of the extension portion 180 is located is a third included angle θ3, the first included angle θ1 is greater than the third included angle θ3, and the third included angle θ3 is greater than the second included angle θ2, that is, the second included angle θ2 is the smallest, which facilitates the adhesion of the layer above the gate insulation layer 200 on the gate insulation layer 200. In addition, the length of the second conductive portion 112 in the first direction is greater than the length in the first direction of the extension portion 180 which is below the second conductive portion 112, so that the resistance of the second conductive portion 112 is greater. The third included angle θ3 being smaller than the first included angle θ1 can make the thickness of the second conductive portion 112 in the direction perpendicular to the base substrate larger, which is beneficial to reduce the resistance of the second conductive portion 112, and the angle relationship of FIG. 3B is more beneficial to the stability of the structure.

For example, schematically, as shown in FIG. 3B, at least part of the second capacitor electrode Cb and the first electrode T1s of the driving transistor T1 are in the same layer and constitute an integrated structure; the first capacitor electrode Ca is insulated from the second capacitor electrode Cb, and the first capacitor electrode Ca and the active layer T1g of the driving transistor T1 are in the same layer and constitute an integrated structure; the second capacitor electrode Cb and the first capacitor electrode Ca respectively constitute two electrodes of the first capacitor C1 of the storage capacitor Cst.

For example, an orthographic projection of the active layer of the driving transistor on the base substrate 101 is located in an orthographic projection of the opaque light shielding layer 170 on the base substrate 101, the light shielding layer 170 is electrically connected to the second capacitor electrode Cb of the first capacitor, and the light shielding layer 170 is insulated from the first capacitor electrode Ca of the first capacitor and is at least partially overlapped with the first capacitor electrode Ca in the direction perpendicular to the base substrate 101 to serve as the third capacitor electrode Cc of the storage capacitor Cst, the third capacitor electrode Cc and the first capacitor electrode Ca respectively constitute two electrodes of the second capacitor C2 of the storage capacitor Cst, and the second capacitor is connected in parallel with the first capacitor to increase the charge storage capacity of the capacitor and better realize the compensation effect of the storage capacitor. The third capacitor electrode Cc is located on the side of the first capacitor electrode Ca away from the second capacitor electrode Cb and is electrically connected to the second capacitor electrode Cb through the No. 7 via hole shown in FIG. 3A to form a parallel capacitor structure, which increases the capacitance value of the storage capacitor Cst.

For example, the first electrode T1s of the driving transistor T1 is located on the side of the active layer T1a of the driving transistor T1 away from the base substrate 101, and the light shielding layer 170 is located on the side of the active layer T1a of the driving transistor T1 close to the base substrate 101.

For example, the second conductive portion 112 and the first electrode T1s of the driving transistor T1 are in the same layer and are made of the same material; the second conductive portion 112 and the first electrode T1s of the driving transistor T1 are both in the third conductive layer 503, and can be formed by performing the same patterning process on the same film, which is beneficial to simplify the manufacture process of the display substrate.

For example, the display substrate 10 further includes a signal line. As shown in FIG. 3A, for example, the display substrate 10 further includes a plurality of signal lines extending in the first direction D1. For example, the signal line may include a data line DL, a power line (for example, a first power line 240 that provides a high power voltage VDD or a second power line 250 that provides the ground power voltage VSS), a detection line 230 or an auxiliary electrode line, etc. As shown in FIG. 3A, each second portion 152 intersects at least one data line in a direction perpendicular to the base substrate 101, thereby defining a plurality of first hollow regions arranged along the second direction D2; each second portion 162 intersects at least one data line in a direction perpendicular to the base substrate 101, thereby defining a plurality of second hollow regions arranged along the second direction D2.

By setting the intersection portion of the scan line and the signal line in a ring structure, that is, a dual-channel structure, the yield of the device can be effectively improved. For example, the position where the signal lines cross is likely to cause a short circuit due to the electrostatic breakdown of the parasitic capacitance, in the case where the short circuit is detected in a channel of the ring structure during the detection process, the channel can be cut off (for example, by laser cutting), and the circuit structure can still work normally through the other channel.

For example, as shown in FIG. 3A, the plurality of signal lines include a plurality of data lines DL, and the plurality of data lines DL are connected in one-to-one correspondence with each column of sub-pixels in the sub-pixel array to provide data signals for the sub-pixels. For a pixel row, the plurality of data lines are divided into a plurality of data line groups in one-to-one correspondence to the plurality of pixel units in the pixel row, as shown in FIG. 3A, each data line group includes a first data line DL1 connected to the first sub-pixel P1, a second data line DL2 connected to the second sub-pixel P2, and a third data line DL3 connected to the third sub-pixel P3. For each pixel unit, the data lines DL1-DL3 corresponding to the pixel unit are located between the first sub-pixel P1 and the third sub-pixel P3. This arrangement can provide space for the installation of the detection line and the power line.

For example, as shown in FIG. 3A, the display substrate 10 further includes a plurality of detection lines 230 extending along the first direction D1, and the detection line 230 is configured to be connected to the detection sub-circuit (such as the third transistor T3) in the sub-pixel 100, and connect the detection sub-circuit to an external detection circuit. For example, at least one column of sub-pixels is between each detection line 230 and any one of the plurality of data lines DL; that is, the detection line 230 is not directly adjacent to any data line DL. For example, as shown in FIG. 3A, for each pixel unit, the first data line DL1 and the second data line DL2 are located between the first sub-pixel P1 and the second sub-pixel P2, the third data line DL3 is located between the second sub-pixel P2 and the third sub-pixel P3, and the detection line 230 is located on a side of the third sub-pixel P3 away from the second sub-pixel P2 and the first sub-pixel P1.

By this arrangement, it is avoided that the data line is directly adjacent to the detection line to cause a resistance-capacitance load which causes a signal delay on the data line, and further avoids problems such as the display unevenness caused by the delay. In addition, because the signal transmitted on the data line DL is usually a high-frequency signal, setting the detection line 230 and the data line DL to be not directly adjacent to each other can prevent the detection line 230 from receiving high-frequency signal crosstalk during the external compensation charging sampling process to affect the sampling accuracy.

For example, as shown in FIG. 3A, the three sub-pixels in the pixel unit share one detection line 230, the one detection line 230 is electrically connected to the second electrodes T3$d$ of the third transistors T3 in the three sub-pixels through the detection portion 231 extending along the second direction D2. The detection line 230 is electrically connected to the detection portion 231 through the via hole 12, and the detection portion 231 is electrically connected to the second electrode T3$d$ of the third transistor T3 through the No. 10 via hole. The first electrode T3$s$ of the third transistor T3 is electrically connected to the first electrode contact region T3$a$1 of the third transistor T3 through the No. 6 via hole, and the second electrode T3$d$ of the third transistor T3 is electrically connected to the second electrode contact region T3$a$2 of the third transistor T3 through the No. 5 via hole.

For example, the first electrode T3$s$ of the third transistor T3 and the second capacitor electrode Cb are in the same layer and are connected to constitute an integrated structure.

For example, as shown in FIG. 3A, the display substrate 10 further includes a plurality of first power lines 240 extending along the first direction D1, and the plurality of first power lines 240 are configured to provide first power voltages for the plurality of sub-pixels. The power voltage is, for example, a high power voltage VDD. The first power line 240 is located in the third conductive layer 503, for example. As shown in FIG. 3A, at least one pixel column is provided between each of the plurality of first power lines 240 and any one of the plurality of data lines; that is, the first power line 240 is not directly adjacent to any one of the data lines DL. By this arrangement, it is avoided that the data line is directly adjacent to the power line to cause the resistance-capacitance load which causes signal delay on the data line, and further avoids the color shift, display unevenness and the like caused by the delay.

For example, any first power line 240 is not overlapped with the detection portion 231 in the direction perpendicular to the base substrate 101, that is, the first power line 240 is provided at an interval between adjacent detection portions 231. This arrangement reduces the overlap of the signal lines, thereby effectively reducing the parasitic capacitance between the signal lines and the signal delay caused thereby.

For example, as shown in FIG. 3B, the first power line 240 is electrically connected to the second electrode T1$d$ of the first transistor T1 of the sub-pixel directly adjacent to the first power line 240 (for example, the first sub-pixel P1) through the No. 3 via hole, and for example, the power line and the second electrode T1$d$ of the first transistor T1 constitute an integrated structure. For example, the first power line 240 is electrically connected to the second electrode T1$d$ of the first transistor T1 of the sub-pixel not directly adjacent to the first power line 240 through the connection electrode 241. For example, the connection electrode 241 is electrically connected to the second electrode T1$d$ of the first transistor T1 of the second sub-pixel or the fourth sub-pixel through the No. 11 via hole.

Figure 5:
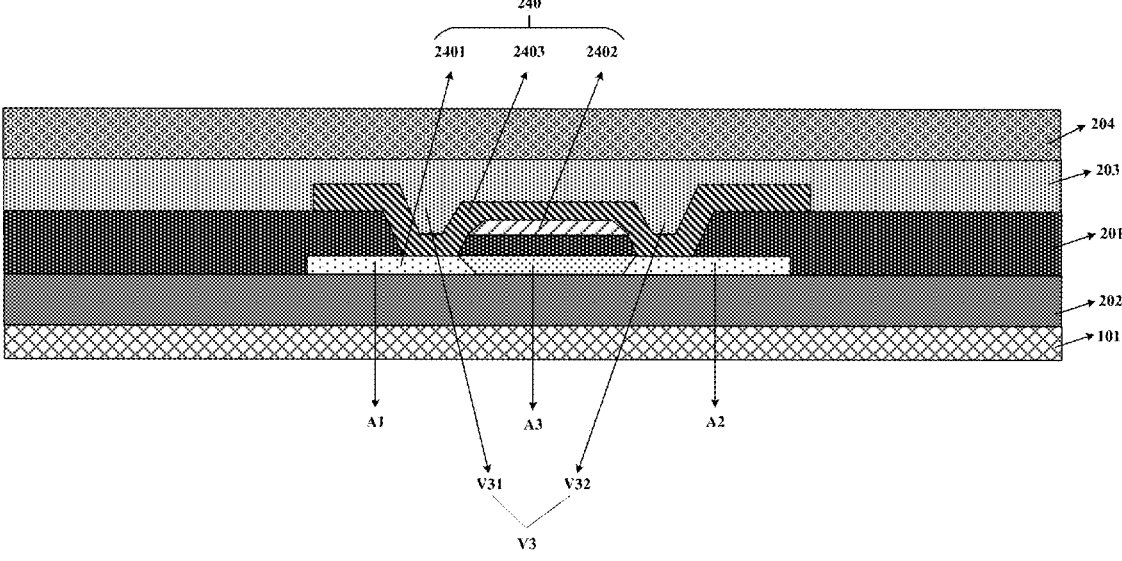
FIG. 5 is a cross-sectional diagram of FIG. 3A taken along a section line A-A'.

FIG. 5 is a cross-sectional diagram of FIG. 3A taken along the section line A-A'. As shown in FIG. 5, in the case that the signal line is the first power line that provides the high power voltage VDD, the signal line, that is, the first power line 240, includes a first layer 2401, a second layer 2402, and a third layer 2403 that are sequentially stacked in the direction perpendicular to the base substrate 101 and away from the base substrate 101, the first layer 2401 and the second layer 2402 are spaced apart from each other; the first power line 240 further includes a signal line via hole V3, and the third layer 2403 is electrically connected to the second layer 2402 and the first layer 2401 through the signal line via hole V3. In this way, in the display substrate provided by the embodiments of the present disclosure, the first layer 2401, the second layer 2402, and the third layer 2403 of the signal line are connected in parallel, which reduces the resistance of the signal line; and the third layer 2403 is electrically connected to the second layer 2402 and first layer 2401 through the only one via hole which is the signal line via hole V3. Compared with other connection methods, the contact resistance at the connection position where the third layer 2403 is electrically connected to the second layer 2402 and first layer 2401 is significantly reduced, and the signal transmission efficiency in the signal line is improved, at the same time, the manufacture process of the display substrate is simplified.

For example, the first layer 2401 and the active layer T1a of the driving transistor T1 are in the same layer, the second layer 2402 and the gate electrode T1g of the driving transistor T1 are in the same layer and are made of the same material, and the third layer 2403 and the first electrode T1s of the driving transistor T1 are in the same layer and are made of the same material. For example, the first layer 2401 further includes a semiconductor portion A3, the semiconductor portion A3 is overlapped with the second layer 2402 in the direction perpendicular to the base substrate 101, and is in the same layer as the active layer T1a of the driving transistor T1, and constitutes an integrated structure with the first conductor portion 111. For example, in the above conducting process performed on the semiconductor layer by using the second conductive layer 502 as a mask, the first layer 2401 and the semiconductor portion A3 shielded by the second layer 2402 are formed at the same time; in this case, the second layer 2402 and the gate electrode T1g of the driving transistor T1 can be formed by the same patterning process, and the third layer 2403 and the first electrode T1s of the driving transistor T1 can be formed by the same patterning process to simplify the process. For example, the first layer 2401 is located in the semiconductor layer 104, the second layer 2402 is located in the second conductive layer 502, and the third layer 2403 is located in the third conductive layer 503. In this way, in the case of reducing the resistance of the signal line as described above, the structure and manufacture process of the display substrate are greatly simplified.

For example, as shown in FIG. 5, the first layer 2401 includes a first conductor portion A1, and the first conductor portion A1 is located on the first side of the second layer 2402; the third layer 2403 is in direct contact with the first conductor portion A1 through the signal line via hole V3 on the first side of the second layer 2402; the third layer 2403 extends in the signal line via hole V3 from the first side of the first conductor portion A1 to the second side of the first conductor portion A1 to be in contact with at least part of the upper surface of the second layer 2402 away from of the base substrate 101. In this way, the contact resistance of the electrical connection between the first conductor portion A1, the second layer 2402 and the third layer 2403 can be further reduced, and the signal transmission efficiency can be improved.

For example, as shown in FIG. 5, the third layer 2403 is in direct contact with the upper surface of the second layer 2402 away from the base substrate 101 and the side surface of the second layer 2402 intersecting the upper surface of the second layer 2402, and the third layer 2403 is in direct contact with the first layer 2401, to further reduce the contact resistance of the electrical connection between the first layer 2401, such as the first conductor portion A1, the second layer 2402, and the third layer 2403, and improve signal transmission efficiency.

For example, as shown in FIG. 5, the first layer 2401 further includes a second conductor portion A2, the second conductor portion A2 is located on the second side of the second layer 2402 in the line width direction of the signal line, the second side of the second layer 2402 is opposite to the first side of the second layer 2402; the third layer 2403 extends in the signal line via hole V3 from the first side of the second layer 2402 and extends across over the second layer 2402 along the line width direction of the signal line to the second side of the second layer 2402, the third layer 2403 is in direct contact with the second conductor portion A2 through the signal line via hole V3 on the second side of the second layer 2402 to increase the contact area between the third layer 2403 and the second layer 2402 and the contact area between the third layer 2403 and the first layer 2401, and reduce the contact resistance between the third layer 2403 and the second layer 2402 and the contact resistance between the third layer 2403 and the first layer 2401.

For example, the signal line via hole V3 includes a first portion V31 and a second portion V32 that communicate with each other. The third layer 2403 is in direct contact with the first conductor portion A1 through the first portion V31 of the signal line via hole V3 on the first side of the second layer 2402; and the third layer 2403 is in direct contact with the second conductor portion A2 through the second portion V32 of the signal line via hole V3 on the second side of the second layer 2402.

FIG. 3A and FIG. 3B take the case that the signal line is the first power line providing the first power voltage to the first electrode T1s of the driving transistor T1 as an example. In some embodiments, the signal line may further include a data line DT, the data line DT is connected to the second electrode T2d of the data writing transistor T2 and is configured to provide a data signal to the data writing transistor T2.

For example, as shown in FIG. 3A, one signal line may be provided with one or more signal line via holes V3. For example, in the example shown in FIG. 3A, one signal line, such as one first power line 240, may be provided with four signal line via holes V3.

For example, in some embodiments, the signal line further includes a detection line 230, and one detection line 230 may include one or more signal line via holes V3.

For example, in some embodiments, the signal line further includes a second power line 250, and the second power line 250 provides a low voltage VSS for the light-emitting device. One second power line 250 may include one or more signal line via holes V3.

Combined with FIGS. 3A-3B and FIG. 4D, the second power line 250 is located in the third conductive layer 503, and is connected to the second electrode 122, such as the cathode, through the No. 13 via hole.

For example, as shown in FIG. 3A, the second power line 250 is connected to the second electrode layer through the No. 14 via hole to form a double-layer line, thereby reducing the resistance of the second power line 250; for example, one second power line 250 includes a plurality of No. 14 via holes. Similarly, the detection line 230 is connected to the second electrode layer through the No. 15 via hole to form a double-layer line, thereby reducing the resistance of the detection line 230; for example, one detection line 230 includes a plurality of No. 15 via holes.

At least one embodiment of the present disclosure further provides a display panel including any of the above display substrates 10. It should be noted that the above display substrate 10 provided by at least one embodiment of the present disclosure may include the light-emitting device 125, or may not include the light-emitting device 125, that is, the light-emitting device 125 may be formed in a panel factory after the display substrate 10 is completed. In the case that the display substrate 10 does not include the light-emitting device 125, the display panel provided by the embodiment of the present disclosure includes the light-emitting device 125 in addition to the display substrate 10.

For example, the display panel is an OLED display panel, and accordingly, the display substrate 10 included in the display panel is an OLED display substrate.

Figure 6:
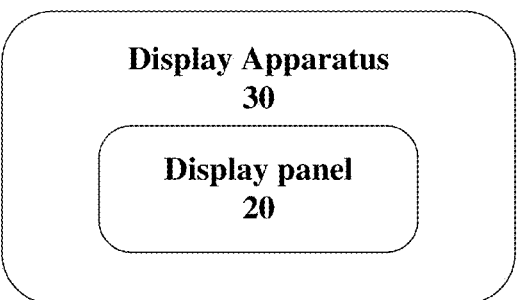
FIG. 6 is a schematic diagram of a display apparatus provided by at least one embodiment of the present disclosure.

At least one embodiment of the present disclosure further provides a display apparatus 30. As shown in FIG. 6, the display apparatus 30 includes any of the above display substrate 10 or display panel 20. The display apparatus in the embodiments of the present disclosure may be: a display, an OLED panel, an OLED TV, an electronic paper, a mobile phone, a tablet computer, a notebook computer, a digital photo frame, a navigator or other products or components with display functions.

At least one embodiment of the present disclosure further provides a manufacture method of the above display substrate, the manufacture method includes: providing a base substrate, forming a plurality of pixels on the base substrate, in which at least part of the plurality of pixels includes a plurality of sub-pixels, each of the plurality of sub-pixels includes a light-emitting device and a pixel circuit configured to drive the light-emitting device to emit light, the pixel circuit includes a light-emitting device, a storage capacitor, a driving transistor and a data writing transistor, each of the driving transistor and the data writing transistor includes an active layer, a gate electrode, a first electrode and a second electrode; the first electrode of the driving transistor is configured to receive a first power voltage, and the second electrode of the driving transistor is connected to the light-emitting device to control the light-emitting device to emit light, and forming a first via hole in at least part of the plurality of sub-pixels, in which the first electrode of the data writing transistor is electrically connected to the gate electrode of the driving transistor and the active layer of the data writing transistor through the first via hole.

For example, the manufacture method of the display substrate includes: forming a semiconductor layer; forming a gate insulation layer covering the semiconductor layer on a side of the semiconductor layer away from the base substrate; forming a gate conductive layer on a side of the gate insulation layer away from the base substrate; patterning the gate conductive layer through a patterning process to form a gate electrode of the driving transistor; and performing a patterning process on the gate insulation layer with the gate electrode of the driving transistor as an etching barrier layer to expose a portion of the semiconductor layer, in which the semiconductor layer includes a portion shielded by the gate insulation layer and a portion not shielded by the gate insulation layer; and performing a conducting process on the portion of the semiconductor layer not shielded by the gate insulation layer to form a first conductive portion, and the portion shielded by the gate insulation layer is not converted into conductor to form the active layer of the driving transistor and a connection portion, in which the gate electrode of the driving transistor includes a main portion and an extension portion connected to the main portion, an orthographic projection of the main portion on the base substrate is overlapped with an orthographic projection of the active layer of the driving transistor on the base substrate, the extension portion extends from the main portion, and the extension portion is electrically connected to the gate electrode of the driving transistor and the active layer of the data writing transistor through the first via hole; the connection portion and the extension portion are overlapped in a direction perpendicular to the base substrate, and the first conductive portion is connected to the active layer of the data writing transistor to form an integrated structure.

For example, forming the first via hole includes: after forming the active layer of the driving transistor and the active layer of the data writing transistor, forming a first insulation layer on a side of the gate electrode of the driving transistor away from the base substrate, in which the first insulation layer covers the gate electrode of the driving transistor, the gate electrode of the data writing transistor and the gate insulation layer; and performing a patterning process on the first insulation layer to form the first via hole, in which the first via hole exposes at least part of the gate electrode of the driving transistor and at least part of the first conductive portion; the manufacture method further includes: forming a second conductive portion on a side of the gate electrode of the driving transistor away from the base substrate, in which the second conductive portion is electrically connected to the gate electrode of the driving transistor and the first conductive portion through the first via hole, and the first conductive portion and the second conductive portion constitute the first electrode of the data writing transistor. Therefore, the first electrode of the data writing transistor is electrically connected to the gate electrode of the driving transistor and the active layer of the data writing transistor through the first via hole.

For example, the manufacture method of the display substrate further includes: forming a signal line, including forming a first layer, a second layer and a third layer that are stacked sequentially in a direction perpendicular to the base substrate and away from the base substrate, in which the first layer is spaced apart from the third layer, the signal line further includes a signal line via hole, and the third layer is electrically connected to the second layer and the first layer through the signal line via hole.

For example, the first layer and the active layer of the driving transistor are formed simultaneously by performing a same conducting process on the portion, not shielded by the gate insulation layer, of the semiconductor layer; the second layer and the gate electrode of the driving transistor are formed simultaneously by performing a same patterning process on the gate conductive layer; and the third layer and the first electrode of the driving transistor are formed simultaneously by performing a same patterning process on a same film.

The manufacture method of the display substrate provided by the embodiments of the present disclosure is exemplarily described below in conjunction with FIGS. 3A-3B and FIGS. 4A-4D, and taking the case of two pixels each of which including three sub-pixels as an example, but the embodiments of the present disclosure are not limited to this case. FIGS. 3A-3B and FIGS. 4A-4D show two pixels of the display substrate, and each pixel includes three sub-pixels. For example, FIGS. 4A-4D show patterns of the first conductive layer, the semiconductor layer, the second conductive layer, and the third conductive layer.

For example, the manufacture method includes the following Steps S1-S5.

Step S1: forming a first conductive material layer, and performing a patterning process on the first conductive material layer to form the first conductive layer 501 as shown in FIG. 4A, that is, the light shielding layer 170 and the third capacitor electrode Cc of the storage capacitor Cst. This patterning process further forms the detection portion 231 and the connection electrode 241 that are insulated from each other.

Step S2: forming a second insulation layer 202 on the first conductive layer 501 and forming a semiconductor material layer on the first insulation layer, and performing a patterning process on the semiconductor material layer to form the semiconductor layer 104 as shown in FIG. 4B, that is, the active layer T1$a$ of the first transistor T1, the active layer T2$a$ of the second transistor T2 and the active layer T3$a$ of the third transistor T3 that are formed spaced apart from each other. For example, when performing the patterning process on the semiconductor material layer, the first layer 2401 of the signal line shown in FIG. 5 is formed through the same patterning process to simplify the manufacture process of the display substrate.

Step S3: forming a gate insulation layer 200 on the semiconductor layer 104 and forming a second conductive material layer on the second insulation layer, and performing a patterning process on the second conductive material layer to form the second conductive layer 502 as shown in FIG. 4C, that is, the gate electrode T1$g$ of the first transistor T1, the gate electrode T2$g$ of the second transistor T2 and the gate electrode T3$g$ of the third transistor T3 that are spaced apart from each other. FIG. 4C also shows the extension portion 180. For example, when performing the patterning process on the second conductive material layer, the second layer 2402 of the signal line shown in FIG. 5 is formed in the second conductive layer 502 by the same patterning process, that is, the second layer and the gate electrode of the driving transistor are simultaneously formed by the same patterning process performed on the gate conductive layer, to simplify the manufacture process of the display substrate.

For example, as shown in FIG. 4C, the second conductive layer 502 further includes a first scan line 150 and a second scan line 160 that are insulated from each other.

For example, the line width of the first scan line 150 and line width of the second scan line 160 range from 5 microns to 15 microns.

For example, the first scan line 150 and the gate electrodes T2$g$ of the second transistors T2 of the corresponding row of sub-pixels form an integrated structure, and the second scan line 160 and the gate electrodes T3$g$ of the third transistors T3 of the corresponding row of sub-pixels form an integrated structure.

Step S4: using a self-aligned process, performing a conducting process (such as a plasma treatment, a doping treatment, etc.) on the semiconductor layer 204 by using the second conductive layer 502 as a mask, so that the portion, not covered by the conductive layer 502, of the semiconductor layer 204 is conductive to obtain the first capacitor electrode Ca, and portions of the active layer of each transistor located on both sides of the channel region are conductive to form the first electrode contact region and the second electrode contact region, respectively. The first electrode contact region and the second electrode contact region are respectively used to be electrically connected to the first electrode and the second electrode of the transistor. FIG. 4B shows the first electrode contact region T1$a$1 and the second electrode contact region T1$a$2 of the active layer T1$a$ of the first transistor T1, the first electrode contact region T2$a$1 and the second electrode region T2$a$2 of the active layer T2$a$ of the second transistor T2, and the first electrode contact region T3$a$1 and the second electrode contact region T3$a$2 of the active layer T3$a$ of the third transistor T3. The connection portion 720 is also shown in FIG. 4B. When performing the conducting process on the semiconductor layer 204 by using the second conductive layer 502 as a mask, the first conductor portion A1, the second conductor portion A2, and the semiconductor portion A3 shown in FIG. 5 are simultaneously formed, that is, the first layer and the active layer of the driving transistor are simultaneously formed by performing the same conducting process on the portion of the semiconductor layer not shielded by the gate insulation layer, so as to simplify the manufacture process of the display substrate.

For example, the gate insulation layer 200 is etched before the semiconductor layer 104 is performed with the conducting process, so that the region of the gate insulation layer 200 not covered by the second conductive layer 502 is all etched, that is, the second insulation layer 200 and the second conductive layer 502 are overlapped in the direction perpendicular to the base substrate 101. In this way, when the conducting process is performed on the region of the semiconductor layer 204 not covered by the second conductive layer 202 by ion implantation, the implanted ions may not be blocked by the gate insulation layer 200.

Step S5: forming a first insulation layer 201 on the second conductive layer 502, forming a third conductive material layer on the first insulation layer 201, and performing a patterning process on the third conductive material layer to form the third conductive layer 503 as shown in FIG. 4D, that is, the first electrode T1$s$ and the second electrode T1$d$ of the first transistor T1, the first electrode T2$s$ and the second electrode T2$d$ of the second transistor T2, and the first electrode T3$s$ and the second electrode T3$d$ of the third transistor T3. When performing the patterning process on the third conductive material layer, the third layer 2403 shown in FIG. 5 is formed simultaneously by the same patterning process, that is, the third layer and the first electrode of the driving transistor are formed simultaneously by performing the same patterning process on the same film, so as to simplify the manufacture process of the display substrate.

For example, the third conductive layer 503 further includes a data line DL, a detection line 230 and a first power line 240 insulated from each other.

For example, the line width of the data line DL ranges from 5 microns to 15 microns, the line width of the detection line 230 ranges from 5 microns to 30 microns, and the line width of the first power line 240 ranges from 5 microns to 30 microns.

For example, as shown in FIG. 4D, the first power line 240 and the second electrode T1$d$ of the first transistor T1 in the directly adjacent (nearest) sub-pixel form an integrated structure. For example, each data line 110 and the second electrode T2$d$ of the second transistor T2 in the sub-pixel connected to the data line 110 form an integrated structure.

For example, the material of the semiconductor material layer includes, but is not limited to, a silicon-based material (amorphous silicon a-Si, polycrystalline silicon p-Si, etc.), a metal oxide semiconductor (IGZO, ZnO, AZO, IZTO, etc.) or an organic material (hexathiophene, Polythiophene, etc.).

For example, the above first conductive material layer is a light shielding conductive material, such as gold (Au), silver (Ag), copper (Cu), aluminum (Al), molybdenum (Mo), magnesium (Mg), tungsten (W), and an alloy material composed of the above metals. For example, the first conductive material layer may be a molybdenum-titanium alloy, for example, the thickness is 50-100 nanometers.

For example, materials of the second conductive material layer and the third conductive material layer may include gold (Au), silver (Ag), copper (Cu), aluminum (Al), molybdenum (Mo), magnesium (Mg), tungsten (W) and an alloy material composed of the above metals; or a conductive metal oxide material, such as indium tin oxide (ITO), indium zinc oxide (IZO), zinc oxide (ZnO), zinc aluminum oxide (AZO), etc.

For example, the second conductive material layer is a stacked structure of molybdenum-titanium alloy and copper, for example, the thickness of the molybdenum-titanium alloy is in a range of 30-50 nanometers, and the thickness of copper is in a range of 300-400 nanometers.

For example, the third conductive material layer is a stacked structure of molybdenum-titanium alloy and copper, for example, the thickness of the molybdenum-titanium alloy is in a range of 30-50 nanometers, and the thickness of copper is in a range of 400-700 nanometers.

For example, the material of the semiconductor material layer includes, but is not limited to, a silicon-based material (amorphous silicon a-Si, polycrystalline silicon p-Si, etc.), a metal oxide semiconductor (IGZO, ZnO, AZO, IZTO, etc.) or an organic material (hexathiophene, Polythiophene, etc.).

For example, the material of the semiconductor material layer is indium gallium zinc oxide with a thickness of 30-50 nanometers.

For example, the second insulation layer 202, the gate insulation layer 200, and the first insulation layer 201 are, for example, inorganic insulation layers, including, for example, oxides of silicon, nitride of silicon or oxynitride of silicon, such as silicon oxide, silicon nitride, silicon oxynitride, etc., or a metal oxynitride insulation material such as aluminum oxide, titanium nitride, etc. For example, these insulation layers may also include an organic material, such as polyimide (PI), acrylate, epoxy resin, polymethyl methacrylate (PMMA), etc., which are not limited in the embodiments of the present disclosure.

For example, the material of the second insulation layer 202 is silicon oxide, and the thickness is 300-500 nanometers. For example, the material of the gate insulation layer 200 is silicon oxide, and the thickness is 100-160 nanometers. For example, the material of the third insulation layer is silicon oxide, and the thickness is 400-600 nanometers.

For example, referring to FIG. 3B, the third insulation layer 203, the color film, and the fourth insulation layer 204 may be sequentially formed on the third conductive layer 503, and the first electrode of the light-emitting device may be formed on the fourth insulation layer 204 123, and then the pixel definition layer 206 is formed on the first electrode 123, and the light-emitting layer 124 and the second electrode 122 are sequentially formed, thus the display substrate 10 as shown in FIG. 3A is formed.

For example, forming the color filter layer may include first forming a red color filter layer and performing a patterning process on the red color filter layer to form a color filter portion corresponding to the red sub-pixel, and then forming a green color filter layer and performing a patterning process on the green color filter layer to form a color filter portion corresponding to the green sub-pixel, and then forming a blue color filter layer and performing a patterning process on the blue color filter layer to form a color filter portion corresponding to the blue sub-pixel.

For example, thicknesses of the red color film, the green color film and the blue color film are respectively 2000-3000 nanometers, that is, the thickness of each color film portion is 2000-3000 nanometers.

For example, between adjacent sub-pixels, a light shielding portion can be formed by overlapping the color filter portions to avoid color crosstalk.

For example, the above patterning process may use a conventional photolithography process, for example, including the steps of photoresist coating, exposure, development, drying, etching, and the like.

The above is only exemplary embodiments of the present invention, and is not intended to limit the scope of the present disclosure. The scope of the present disclosure is defined by the appended claims.

What is claimed is:

1. A display substrate, comprising:

a base substrate, provided with a plurality of pixels in an array, wherein at least part of the plurality of pixels comprises a plurality of sub-pixels, at least part of the plurality of sub-pixels comprises a light-emitting device and a pixel circuit configured to drive the light-emitting device, and the pixel circuit comprises a storage capacitor, a driving transistor and a data writing transistor, the driving transistor comprises an active layer, a gate electrode, a first electrode and a second electrode, the data writing transistor comprises an active layer, a gate electrode, a first electrode and a second electrode; the first electrode of the driving transistor is configured to receive a first power voltage, and the second electrode of the driving transistor is connected to the light-emitting device to control the light-emitting device to emit light, at least part of the plurality of sub-pixels comprises a first via hole, and the first electrode of the data writing transistor is electrically connected to the gate electrode of the driving transistor and the active layer of the data writing transistor through the first via hole;

the gate electrode of the driving transistor comprises a main portion and an extension portion connected to the main portion, an orthographic projection of the main portion on the base substrate is overlapped with an orthographic projection of the active layer of the driving transistor on the base substrate, and the extension portion extends from the main portion, and the extension portion is electrically connected to the first electrode of the data writing transistor and the active layer of the data writing transistor through the first via hole;

the display substrate further comprises:

a gate insulation layer, between the gate electrode of the driving transistor and the active layer of the driving transistor, wherein the gate electrode of the driving transistor is on a side of the gate insulation layer away from the base substrate; and a first insulation layer, on a side of the gate electrode of the driving transistor away from the base substrate, wherein the first via hole penetrates the gate insulation layer and the first insulation layer;

the first electrode of the data writing transistor comprises a first conductive portion and a second conductive portion that are stacked with each other in a direction perpendicular to the base substrate, and the second conductive portion is on a side of the first conductive portion away from the base substrate;

the extension portion comprises a side surface intersecting the upper surface, and the second conductive portion further covers the side surface of the extension portion and contacts the side surface of the extension portion;

the gate insulation layer comprises an upper surface and a side surface intersecting the upper surface of the gate insulation layer, an included angle, close to the extension portion, in included angles between the side surface of the extension portion and a plane where the upper surface of the extension portion is located is a first included angle, and an included angle, close to the extension portion, in included angles between the side surface of the gate insulation layer and the plane where the upper surface of the extension portion is located is a second included angle, the second conductive portion comprises a middle portion in direct contact with the extension portion, and an included angle, close to the extension portion, in included angles between a side surface of the middle portion and the plane where the upper surface of the extension portion is located is a third included angle;

the first included angle is greater than the third included angle and the third included angle is greater than the second included angle;

an effective thickness of an overlapping part between the second conductive portion and a side surface and an upper surface of the extension portion is greater than an overlapping thickness between the second conductive portion and the first conductive portion;

a plurality of data lines, a detection line and a second power line, at least one column of sub-pixels is between the detection line and any one of the plurality of data lines, and the detection line is adjacent to the second power line.

2. The display substrate according to claim 1, wherein the gate electrode of the driving transistor is on a side of the first conductive portion close to the second conductive portion and is spaced apart from the first conductive portion, and the second conductive portion is in contact with the gate electrode of the driving transistor and the first conductive portion through the first via hole;

the display substrate further comprises:

a connection portion which is overlapped with the extension portion in the direction perpendicular to the base substrate, and connects the first conductive portion with the active layer of the data writing transistor; the connection portion, the first conductive portion and the active layer of the data writing transistor constitute an integrated structure.

3. The display substrate according to claim 2, wherein a material of the second conductive portion and a material of the connection portion comprise a same semiconductor material, and the semiconductor material in the first conductive portion is converted into a conductive material.

4. The display substrate according to claim 1, wherein the first conductive portion comprises:

a first sub-portion, on a first side of the extension portion, wherein the second conductive portion is in direct contact with the first sub-portion through the first via hole on the first side of the extension portion;

the second conductive portion extends from the first side of the extension portion to the extension portion in the first via hole to contact at least part of an upper surface of the extension portion away from the base substrate.

5. The display substrate according to claim 4, wherein the first conductive portion further comprises:

a second sub-portion on a second side of the extension portion, wherein the second side of the extension portion is opposite to the first side of the extension portion, the second conductive portion extends in the first via hole from the first side of the extension portion to the extension portion, and extends across over the extension portion to extend to the second side of the extension portion, and the second conductive portion is in direct contact with the second sub-portion through the first via hole on the second side.

6. The display substrate according to claim 1, wherein the storage capacitor comprises a first capacitor electrode and a second capacitor electrode;

at least part of the second capacitor electrode and the first electrode of the driving transistor are in a same layer and constitute an integrated structure; and the first capacitor electrode is insulated from the second capacitor electrode, the first capacitor electrode and the active layer of the driving transistor are in a same layer and constitute an integrated structure, the second capacitor electrode and the first capacitor electrode respectively constitute two electrodes of a first capacitor of the storage capacitor.

7. The display substrate according to claim 6, further comprising:

a light shielding layer that is opaque, wherein an orthographic projection of the active layer of the driving transistor on the base substrate is in an orthographic projection of the light shielding layer on the base substrate, and the light shielding layer is electrically connected to the second capacitor electrode of the first capacitor, the light shielding layer is insulated from the first capacitor electrode of the first capacitor and at least partially overlapped with the first capacitor electrode of the first capacitor in a direction perpendicular to the base substrate to serve as a third capacitor electrode of the storage capacitor, the third capacitor electrode and the first capacitor electrode respectively constitute two electrodes of a second capacitor of the storage capacitor, and the second capacitor is connected in parallel with the first capacitor.

8. The display substrate according to claim 7, wherein the first electrode of the driving transistor is on a side of the active layer of the driving transistor away from the base substrate, and the light shielding layer is on a side of the active layer of the driving transistor close to the base substrate.

9. The display substrate according to claim 8, wherein the second conductive portion and the first electrode of the driving transistor are in a same layer and are made of a same material.

10. The display substrate according to claim 1, further comprising: a signal line, wherein the signal line comprises a first layer, a second layer and a third layer that are stacked sequentially in a direction perpendicular to the base substrate and away from the base substrate, wherein the first layer is spaced apart from the second layer, the signal line further comprises a signal line via hole, and the third layer is electrically connected to the second layer and the first layer through the signal line via hole.

11. The display substrate according to claim 10, wherein the first layer and the active layer of the driving transistor are in a same layer, the second layer and the gate electrode of the driving transistor are in a same layer and are made of a same material, and the third layer and the first electrode of the driving transistor are in a same layer and are made of a same material.

12. The display substrate according to claim 10, wherein the first layer comprises:

a first conductor portion on a first side of the second layer, wherein the third layer is in direct contact with the first conductor portion through the signal line via hole on the first side of the second layer; and the third layer extends in the signal line via hole from the first side of the first conductor portion to a second side of the first conductor portion to contact at least part of an upper surface of the second layer away from the base substrate.

13. The display substrate according to claim 12, wherein the third layer is in direct contact with the upper surface of the second layer away from the base substrate and a side surface of the second layer intersecting the upper surface of the second layer, and the third layer is in direct contact with the first layer.

14. The display substrate according to claim 12, wherein the first layer further comprises:

a second conductor portion, on a second side of the second layer in a line width direction of the signal line, wherein the second side of the second layer is opposite to the first side of the second layer, the third layer extends in the signal line via hole from the first side of the second layer along the line width direction of the signal line, across over the second layer, to the second side of the second layer, and the third layer is in direct contact with the second conductor portion through the signal line via hole on the second side of the second layer.

15. The display substrate according to claim 14, wherein the first layer further comprises:

a semiconductor portion, overlapped with the second layer in a direction perpendicular to the base substrate, in a same layer as the active layer of the driving transistor, and constitutes an integrated structure with the first conductor portion.

16. The display substrate according to claim 10, wherein each of the data lines is connected to the second electrode of the data writing transistor and configured to provide a data signal to the data writing transistor, wherein the signal line comprises the data line.

17. A display apparatus, comprising the display substrate according to claim 1.

18. A manufacture method of a display substrate, comprising:

providing a base substrate, forming a plurality of pixels on the base substrate, wherein at least part of the plurality of pixels comprises a plurality of sub-pixels, each of the plurality of sub-pixels comprise a light-emitting device and a pixel circuit configured to drive the light-emitting device to emit light, the pixel circuit comprises a light-emitting device, a storage capacitor, a driving transistor and a data writing transistor, each of the driving transistor and the data writing transistor comprises an active layer, a gate electrode, a first electrode and a second electrode; the first electrode of the driving transistor is configured to receive a first power voltage, and the second electrode of the driving transistor is connected to the light-emitting device to control the light-emitting device to emit light, and forming a first via hole in at least part of the plurality of sub-pixels, wherein the first electrode of the data writing transistor is electrically connected to the gate electrode of the driving transistor and the active layer of the data writing transistor through the first via hole;

the gate electrode of the driving transistor comprises a main portion and an extension portion connected to the main portion, an orthographic projection of the main portion on the base substrate is overlapped with an orthographic projection of the active layer of the driving transistor on the base substrate, and the extension portion extends from the main portion, and the extension portion is electrically connected to the first electrode of the data writing transistor and the active layer of the data writing transistor through the first via hole;

the display substrate further comprises:

a gate insulation layer, between the gate electrode of the driving transistor and the active layer of the driving transistor, wherein the gate electrode of the driving transistor is on a side of the gate insulation layer away from the base substrate; and a first insulation layer, on a side of the gate electrode of the driving transistor away from the base substrate, wherein the first via hole penetrates the gate insulation layer and the first insulation layer;

the first electrode of the data writing transistor comprises a first conductive portion and a second conductive portion that are stacked with each other in a direction perpendicular to the base substrate, and the second conductive portion is on a side of the first conductive portion away from the base substrate;

the extension portion comprises a side surface intersecting the upper surface, and the second conductive portion further covers the side surface of the extension portion and contacts the side surface of the extension portion;

the gate insulation layer comprises an upper surface and a side surface intersecting the upper surface of the gate insulation layer, an included angle, close to the extension portion, in included angles between the side surface of the extension portion and a plane where the upper surface of the extension portion is located is a first included angle, and an included angle, close to the extension portion, in included angles between the side surface of the gate insulation layer and the plane where the upper surface of the extension portion is located is a second included angle, the second conductive portion comprises a middle portion in direct contact with the extension portion, and an included angle, close to the extension portion, in included angles between a side surface of the middle portion and the plane where the upper surface of the extension portion is located is a third included angle;

the first included angle is greater than the third included angle and the third included angle is greater than the second included angle;

an effective thickness of an overlapping part between the second conductive portion and a side surface and an upper surface of the extension portion is greater than an overlapping thickness between the second conductive portion and the first conductive portion;

a plurality of data lines, a detection line and a second power line, at least one column of sub-pixels is between the detection line and any one of the plurality of data lines, and the detection line is adjacent to the second power line.

* * * * *